(12) United States Patent
Petrovic

(10) Patent No.: US 7,646,264 B2
(45) Date of Patent: Jan. 12, 2010

(54) VARACTOR TUNABLE RF FILTERS HAVING LOW DISTORTION AND HIGH SIGNAL LEVEL CAPABILITY

(75) Inventor: Branislav Petrovic, La Jolla, CA (US)

(73) Assignee: Broadband Innovations, Inc., San Diego, CA (US)

( * ) Notice: Subject to any disclaimer, the term of this patent is extended or adjusted under 35 U.S.C. 154(b) by 635 days.

(21) Appl. No.: 11/347,327

(22) Filed: Feb. 6, 2006

(65) Prior Publication Data

US 2006/0128339 A1 Jun. 15, 2006

Related U.S. Application Data

(63) Continuation of application No. 09/574,707, filed on May 18, 2000, now Pat. No. 7,003,275.

(51) Int. Cl.
*H03H 7/12* (2006.01)
(52) U.S. Cl. .................................. 333/176; 333/174
(58) Field of Classification Search ............ 333/174, 333/32, 165, 166, 167, 175, 176
See application file for complete search history.

(56) References Cited

U.S. PATENT DOCUMENTS

| 3,533,020 A | * | 10/1970 | Hecht | 333/17.1 |
| 5,416,449 A | * | 5/1995 | Joshi | 332/170 |
| 6,084,486 A | * | 7/2000 | Suzuki et al. | 333/174 |
| 6,108,569 A | * | 8/2000 | Shen | 505/210 |

* cited by examiner

*Primary Examiner*—Benny Lee
*Assistant Examiner*—Gerald Stevens
(74) *Attorney, Agent, or Firm*—Larry T. Cullen

(57) ABSTRACT

An agile frequency converter provides IF-RF level exchange and notch filtering. System noise and spurious levels generated by channel frequency conversion is reduced in applications requiring broadband combining of frequency converters to form multichannel composite signal. A pair of varactor banks is connected in an arrangement whereby varactor pairs are connected in parallel and capacitor pairs are connected in anti-parallel. Tuning is achieved by circuitry for tuning first and second varactors.

12 Claims, 13 Drawing Sheets

VARACTOR TUNABLE RF FILTERS HAVING LOW DISTORTION AND HIGH SIGNAL LEVEL CAPABILITY

CROSS-REFERENCE TO RELATED APPLICATION

This application is a continuation of U.S. patent application Ser. No. 09/574,707, filed May 18, 2000 now U.S. Pat. No. 7,003,275.

BACKGROUND OF THE INVENTION

1. Field of the Invention

This invention relates to the conversion of the constituent frequencies of each of a set of baseband signals to one of a set of RF channels such that the baseband signals can be combined and distributed as a single composite broadband signal, and more specifically to an exemplary frequency conversion apparatus used in multichannel systems such as cable TV (CATV) head-ends, necessary for transmission of analog TV signals, digital QAM signals used in digital TV and high speed Internet communications, and more particularly to an improved agile frequency conversion method and apparatus that attenuates broadband system noise using an IF-RF level exchange and attenuates distortion components using tunable notch filters, on a channel-by-channel basis, to a ensure that the aggregate carrier-to-noise (C/N) and carrier-to-distortion (C/D) performance levels specified for the multichannel system are met.

2. Background of the Related Art

In typical broadband multichannel systems such as those used for cable television transmission, a set of baseband television signals are combined for simultaneous transmission and distribution in the form of a single composite broadband signal. For a cable television system, a subscriber receives the entire broadband signal simultaneously and discriminates between (or tunes receiving equipment to) one of the unique channels assigned to each of the base-band signals to view the selected base-band signal. To generate the broadband signal, each of the base-band signals must modulate one of a unique set of RF carrier frequencies, each set assigned to one of the channels so that a subscriber may tune receiving equipment to that RF channel frequency carrying the desired baseband signal. The receiving equipment then demodulates the carrier(s) to recover the baseband signal for viewing and listening.

Typical services offered to subscribers in a modern CATV plant include analog TV, digital services via high-speed data modems for digital TV and high speed Internet communications. The analog TV utilizes analog amplitude modulation, while digital services use quadrature amplitude modulation with 64 or 256 levels (i.e. 64 or 256 QAM). The composite broadband signal is generated at the head-end of the cable TV system for distribution to subscribers. While this composite signal typically includes signals carrying analog modulation combined with signals carrying digital modulation, the manner in which it is generated can be illustrated by the following steps, using analog modulation as an example.

First, each of a set of baseband signals (5, FIG. 3) is modulated on the same standard IF carrier frequency. In the case of video signals, the baseband signal (occupying a frequency range of DC to 4.2 MHz) modulates an IF sub-carrier $IF_{C(vid)}$ 9 of 45.75 MHz using amplitude modulation (AM). Baseband audio signals (occupying a frequency range of 20 Hz to 20 KHz) modulate an IF sub-carrier $IF_{C(aud)}$ 8 of 41.25 MHz using frequency modulation (FM). For each of the baseband signals, these two modulated components are combined to create a composite modulated IF signal (10, FIG. 1), which includes the modulated sub-carrier components 8 and 9 and all of the associated side-band components generated by the modulation process.

To assign each of the baseband signals to a unique RF channel, each of the composite IF signals and their associated modulation side-band components are up-converted to occupy a unique one of a set of contiguous RF channel frequency bands. Although each up-converted signal occupies a range of frequencies within its assigned RF channel band, those of skill in the art will recognize that it is often easier to refer to or illustrate an up-converted signal by a primary one of its up-converted sub-carrier components for simplicity. In this description using analog TV as an example, the video sub-carrier of the various composite signals will often be used as a reference to the entire signal.

A conceptual representation of this up-conversion process is illustrated in FIG. 1. The RF channel frequency bands 12 are typically contiguous, 6 MHz wide and occupy an RF channel frequency range 14 of about 50 MHz to about 870 MHz (i.e. about 137 channels at 6 MHz per channel). The up-converted signals are normalized to a certain amplitude, typically amplified to a desired output level, and then summed together to form the composite broadband signal to be distributed. In this way, several baseband modulated IF signals that would otherwise occupy the same frequency range can be transmitted together without significant interference with one another.

Because the circuitry used to implement the up-conversion process is not perfect, however, interference between channels in the form of noise and distortion can still cause unacceptable performance in such systems. The composite broadband signal contains not only the up-converted baseband modulated IF signals occupying their assigned RF channel frequency ranges, but also distortion components (including harmonics and inter-modulation products) and cumulative broadband noise associated with each of the up-converted IF composite signals (artifacts of the imperfect up-conversion process and apparatus). Attenuating the power levels of these noise and distortion components to reach acceptable levels of aggregate system performance poses one of the more significant and challenging problems faced by designers of such broadband multichannel systems.

FIG. 2 illustrates one of the n RF channel bands 12 of RF channel frequency range 14, along with the up-converted composite IF signal of interest 11 having an RF carrier frequency ($RF_C$) 13, various distortion components 20 and system noise 22 generated during the up-conversion and modulation processes. For a single channel in isolation, these noise and distortion components do not pose a problem because they typically fall outside of the channel band 12 for the signal of interest 11. When 60 to over 130 channels are summed together to create the composite broadband output signal for systems such as CATV, however, the distortion components can be superimposed over, and can therefore interfere with, other composite RF signals occupying other RF channel bands 12 in the RF frequency range 14. Moreover, the system noise 22 generated during the up-conversion of each of the channels is summed together such that the noise floor 24 in the aggregate can rise to unacceptable levels with respect to the levels of the composite RF signals.

FIG. 3 is a conceptual representation of the summing process that occurs to create a composite broadband signal at the head end of a multichannel system such as CATV. Each channel processor 30 receives source signals $S_n$ 5, and generates a frequency up-converted composite signal $RF_{OUT(N)}$ 33 that carries the base-band source signal information and falls within one of the RF channel frequency bands. Each of the $RF_{OUT}$ signals 33 is then summed together using conceptual summing element 32 prior to distribution of the composite broadband signal $RF_{BB}$ 34.

The channel processors 30 are typically designed to normalize the output power levels of the RF signals and amplify them to the desired output level so that they are equal before summing them together. Thus, the distortion components produced by the up-conversion process for any of the channels will all nominally have the same power relative to the signal $RF_{OUT}$ 33, including its RF channel carrier component (i.e. $RF_C$ 13, FIG. 2) as well as all of the carrier components of any of the other n channels. It follows then that the aggregate carrier-to-distortion ratio (C/D) permitted for the system can be met by optimizing distortion levels generated by the up-conversion process for channels on an individual basis. With respect to system noise, however, the noise generated by each channel processor is cumulative and thus noise reduction must be optimized for all of the channels in the aggregate.

In today's CATV systems, it is expected that each channel should have no less than a 65 dB attenuation of both distortion components and cumulative broadband noise relative to the signal power of the RF carrier signal components of each of the channels. These two specifications are commonly referred to as aggregate carrier to distortion (C/D) and aggregate carrier to noise (C/N) ratios respectively.

One seemingly obvious approach to solving the problem of sufficiently attenuating distortion and noise signals in the broadband signal is to filter each RF channel output signal $RF_{OUT}$ (33, FIG. 3) through a band-pass filter substantially tuned to the $RF_C$ (channel carrier frequency) of the assigned channel to attenuate the out-of-band distortion and noise signals 20 and 22 of FIG. 2. The problem with this approach is that each channel processor 30 would have to be manufactured with a different band-pass filter having a center frequency dictated by the frequency band 12 of the channel to which it is assigned. Thus, each channel processor would be dedicated to a specific channel (or range of channels), rather than having the agility necessary to operate for any one of the RF channels in the system. This type of static design is contrary to today's multichannel systems applications that demand agility in design such that each channel processor 30 is capable of assignment to any channel in the RF channel frequency range (14, FIG. 1).

Moreover, this static solution would require equipment manufacturers to manufacture, test and stock different channel processors 30 for each channel (or range of channels), increasing manufacturing costs and requiring purchasers to maintain an inventory of replacement parts for each of the channel processors 30. Because a cable television system can provide between 60 and over 130 channels, this solution becomes impractical and cost prohibitive. Nor can tunable band-pass filters be used to render this solution agile, because tunable bandpass filters include non-linear elements that would themselves introduce distortion components into the broadband signal, making the 65 dB C/N and C/D specifications virtually impossible to meet or exceed.

FIG. 4 is a conceptual illustration of a known channel processor 30. Those of skill in the art will recognize that channel processors 30 may contain additional elements, but the elements pertinent to this discussion include up-converter 38 and modulator 36. Modulator 36 performs the modulation of a baseband source or information signal S 5 (e.g. video 35 and audio 37 signals for cable television) on one or more IF carrier signals to create the composite signal IF 31. As previously discussed, in a CATV system the IF signal 31 is a composite signal incorporating base-band signals for video and audio each modulating two separate sub-carriers. Composite signal IF 31 is then input to up-converter 38, which up-converts the composite signal IF 31 (including all of its modulation side-band components) to a composite RF output signal $RF_{OUT}$ 33 occupying the RF channel frequency band 12 corresponding to the assigned RF channel.

FIG. 5a provides a simple conceptual representation of a single-stage up-converter 38s. Composite signal IF 31, having at least one sub-carrier frequency component $IF_C$ and its associated modulation side-band components, is input to a mixer 45 and combined with a local oscillator signal $L_O$ 56 to produce composite signal RF' 39. The constituents of composite signal RF' 39 are conceptually illustrated in FIG. 5b, which include upper 51 and lower 42 side-band RF signals, system noise and harmonic distortion components (not shown), and local oscillator and IF leakage components $L_{O(L)}$ 44 and $IF_{(L)}$ 58 respectively. Thus, the result of the mixing process is that the composite signal IF 31, including all of its associated modulation side-band components, is up-converted to produce upper and lower side-band signals 51 and 42 respectively, and wherein each now comprises an up-converted RF channel carrier component. Channel sub-carrier frequencies $RF_{C(upp)}$ 53 and $RF_{C(low)}$ 41 are related to $IF_C$ 9 (FIG. 1) by the following equations: $RF_{C(upp)} = L_O + IF_C$ and $RF_{C(low)} = L_O - IF_C$. Those of skill in the art will recognize that the other frequency components of composite signal IF 31 have also been up-converted to a frequency equal to their original IF frequency plus and minus $L_O$. Hereafter the composite signals typically will be referred to by one of their primary sub-carrier frequency components for simplicity.

As illustrated in FIG. 5b, because of leakage through the imperfect mixer 45, an oscillator leakage component $L_{O(L)}$ 44 is produced at the frequency of $L_O$ as well as a leakage component $IF_{(L)}$ 58 at the primary carrier frequency $IF_C$ 9 of the composite signal IF 31. Composite signal RF' 39 is passed through bandpass filter 54 having transfer function 48 to produce a single side-band composite RF output signal 42, while eliminating the upper side-band and leakage components. Up-converted RF output signal 42 is then conditioned by circuit block 59 to normalize the signal output levels and typically to amplify the signal levels of $RF_{out}$ 33, before combining it with the other up-converted channel outputs to produce the broadband signal $RF_{BB}$ 34 for transmission/distribution.

To isolate the desired side-band carrier component 42 of RF' 39 and to meet the aggregate performance specifications required of a multichannel system such as cable television, the levels of signal components 58, 44 and 51 of RF' 39 must be generated at or attenuated to a level that is at least 65 dB below the signal level of carrier component $RF_{C(low)}$ 41. The signal level of carrier component 41 starts out already 7 dB below the signal level of $IF_C$ 9 of IF 31 because of conversion loss of about 7 dB associated with the mixer 45. Moreover, mixer 45 can require a range of power levels for the oscillator signal $L_O$ 56 on the order of 7 dBm to 21 dBm. Although it might be desirable to overcome the conversion loss of the mixer by increasing the power of IF 31, this will cause the levels of distortion components to increase on RF' 39. Thus the upper limit to the input level of IF 31 is approximately −10 dBm and the output power of RF' 39 will be −17 dBm. If the mixer 52 requires the signal $L_O$ 56 to be 20 dBm and the $L_O$ rejection is approximately 25 dB, then the oscillator leakage component $L_{O(L)}$ 44 will be at about −5 dBm, and therefore approximately 12 dB hotter than the side-band carrier signal component $RF_{C(low)}$ 41. Therefore, to reach the −65 dB specification, a filter must actually attenuate the oscillator leakage component $L_{O(L)}$ 44 by at least 77 dB. Such a response is difficult to achieve even with a fixed band-pass filter let alone one that is tunable.

In an attempt to meet this difficult performance specification while maintaining an agile system, a dual or two-stage frequency conversion has been employed. FIG. 6a illustrates the concept of a prior art dual or two-stage frequency up-converter 38d. For the first conversion stage, modulated composite signal IF 31 is input to mixer 52 along with a local oscillator signal $L_{O1}$ 66 and a resulting composite signal IF' 60 is produced and input to a fixed bandpass filter 64. Bandpass filter 64 then produces composite signal $IF_1$ 68. This first conversion stage operates in the same manner as the single conversion circuit 38s of FIG. 5a, producing an up-converted IF output signal IF' 60 analogous to RF' 39 illustrated in FIG. 5b. The primary difference is that the first stage up-converts the modulated composite signal IF 31 to intermediate composite signal $IF_1$ 68 having a carrier frequency much greater than the RF channel frequency range 14 of the system. For the second conversion stage, $IF_1$ 68 is input to a second mixer 61 and mixed with a second local oscillator signal $L_{O2}$ 63 to produce composite RF signal RF' 65. The frequency of oscillator signal $L_{O2}$ 63 is chosen such that the lower side-band component of $RF_2$ 65 falls within the appropriate channel band 12 of the RF channel frequency range 14, corresponding to the channel to which the channel processor 30 is currently assigned. RF' 65 is then input to RF attenuator 67, which produces an output $RF_N$ 57 that is normalized to a constant power level relative to each of the RF outputs of the other channel processors 30 of the system.

FIG. 6b provides a conceptual illustration of the constituent signals produced by this dual conversion process. As previously discussed, the first conversion stage up-converts its composite modulated signal IF 31 to produce output IF' 60, which includes upper and lower side-band components 71 and 74 respectively. For a CATV system, the frequency of oscillator signal $L_{O1}$ 66 is chosen such that the frequency of the primary carrier $IF'_{C(Upp)}$ 79 of upper side-band component 71 is equal to approximately 1 GHz; the frequency of $IF'_{C(Upp)}$ 79 is equal to $L_{O1}$+IF. It should be noted that the oscillator leakage component $L_{O1(L)}$ 73 corresponding to local oscillator signal $L_{O1}$ 66, as well as lower side-band component 74, fall outside of the RF channel frequency range 14. Lower side-band component 74, as well as local oscillator leakage component 73 are then attenuated by fixed bandpass filter 64 having transfer function 72 such that composite signal $IF_1$ 68 contains only upper side-band component 71.

The second conversion stage then down-converts upper side-band component 71 of $IF_1$ 68 to a one of a range of frequencies that falls within the RF channel band 12 of RF channel range 14 that corresponds to the channel to which channel processor 30 is currently assigned. The down-conversion of composite signal $IF_1$ 68 is effected by mixing $IF_1$ 68 with local oscillator signal $L_{O2}$ 63 using mixer 61 to produce a second converted composite signal RF' 65, which includes lower side-band component 76, an upper side-band component (not shown), and oscillator leakage component $L_{O2(L)}$ 75(L-U). The frequency of local oscillator signal $L_{O2}$ 63 is chosen such that the primary RF sub-carrier frequency component $RF'_C$ 62 of the lower side-band component 76 of composite signal RF' 65 falls within the assigned RF channel frequency band 12. The frequency of lower sideband carrier component $RF'_C$ 62 is equal to $L_{O2}-IF_{1C}$, where $IF_{1C}$ is the primary sub-carrier component of $IF_1$ 68.

FIG. 6b also illustrates the range of operation of the dual conversion for an exemplary cable TV system. For each channel processor 30, $L_{O2}$ 63 has one of a set of frequency values falling within the range of about 1070 MHz to about 1880 MHz (corresponding to a range of oscillator leakage components 75L-U. Each value of $L_{O2}$ 63 produces a lower sideband component 76L-U of RF' 65 having a frequency range falling within one of the set of RF channel bands 12 ranging from RF channels 1 (12L) through n (12U). Note that the upper sideband component of RF' 65 (not shown) having a primary sub-carrier frequency equal to $L_{O2}+IF_{1C}$, and the range of oscillator leakage components $L_{O2(L)}$ 75L-U associated with local oscillator signal $L_{O2}$ 63, fall outside of the RF channel frequency range 14 for the entire range of the system's operation.

Those with skill in the art will recognize that this prior art two-stage conversion technique provides system agility by eliminating the need to attenuate leakage and unwanted sideband components from the composite signal RF' 65 using filtering techniques. No filtering of these components is required because they all fall outside of the RF channel frequency range 14. Thus, each channel processor 30 can be assigned to up-convert composite IF signals to any one of the RF channels contained in channel range 14 simply by adjusting the value of local oscillator frequency $L_{O2}$ 63 between the frequency values of about 1070 MHz and approximately 1880 MHz.

Eliminating the need to filter these components does not, however, solve all of the problems associated with higher-order distortion components and broadband noise. With respect to distortion, two additional second-order distortion components generated by the prior art two-stage conversion above still find their way into the RF channel range and become the dominant limiting factor on distortion performance in the up-converters of FIGS. 5a and 6a. One such component is the second harmonic 2RF' 85 of the composite signal RF' 65, which has a sub-carrier frequency component 81 having a frequency equal to 2RF' as illustrated in FIGS. 7a and 7b. A second distortion component 86 of RF' 65 has a primary carrier component 82 the frequency of which is equal to $IF_{1C}-RF'_C$. As can be seen from FIGS. 7a and 7b, as the frequency of $RF'_C$ 62 increases, the second harmonic component 81 increases in frequency at the rate of $2RF'_C$ and distortion component 82 decreases in frequency and moves right to left on the frequency graph of FIGS. 7a and 7b.

Second harmonic distortion sub-carrier component 81 presents a problem for lower channels in a CATV system because for the lower half of the channel frequency range 14, the second harmonic component given by 2RF' still falls inside the channel frequency range 14, and thus interferes with other channels. On the positive side, component 81 is always filterable because it is always at a frequency of twice the frequency of the sub-carrier of the signal of interest, $RF'_C$ 62. As can be seen from FIG. 7b, however, distortion sub-carrier component 82 (it moves from right to left with increasing frequency of $RF'_C$ 62), can become too proximate in frequency to $RF'_C$ 62 such that it cannot be filtered without attenuating the up-converted signal of interest RF' 65 as well. Component 82 can for some frequencies even fall directly within the very channel frequency band 12 to which the up-converted composite signal $RF_2$ 65 is assigned.

The typical prior art approach to addressing the attenuation of second-order distortion components 81, 82 is to simply design all of the channel processors 30 such that the power output levels of the distortion components 82, 81 will always be at least 65 dB down from the power level of $RF'_C$ 62. If so designed, no attenuation of distortion components 81, 82 by filtering is required. This is accomplished through the design of mixer 61 and the choice of input levels for signals $IF_1$ 68 and $L_{O2}$ 63. Put another way, mixer 61 (FIG. 6a) must be constrained by design and operation such that the distortion components 81, 82 (FIGS. 7a and 7b) are guaranteed to always be a minimum of 65 dB down from the power level of the carrier signal component RF'$_C$ 62 of RF' 65. Regrettably, this technique for meeting the C/D specification comes at the expense of the C/N ratio as explained below.

To meet the C/D specification, the primary constraint on the operation of mixer 61 will be the maximum input level of IF$_1$ 68 into mixer 61. For every 1 dB increase in signal power of IF$_1$ 68, the distortion components 81, 82 (the frequencies of which are equal to 2RF'$_C$ and IF$_{1C}$–RF'$_C$ respectively) will increase by 2 dB. Thus, for every 1 dB of increase in IF$_1$ 68 there will be a loss of 1 dBc/dB in the C/D ratio. As a result, an upper limit must be imposed on the input level that is permissible for IF$_1$ 68 to ensure compliance with the C/D specification. The problem with constraining the input level of IF$_1$ 68, however, is that the output level of RF' 65 will also be lower with respect to the broadband system noise floor, thereby lowering the C/N performance. This problem is further exacerbated by the fact that the lower output level of RF' 65 typically must be compensated through post-mixing amplification, using amplifier 55, which not only amplifies the output level of RF' 65, but also the system noise level at the RF$_{output}$ 33.

Thus, the prior art two-stage frequency converter of FIG. 6a must still somehow meet the cumulative broadband or system noise performance requirement of –65 dB, despite the constraints being placed on the pre-mixer input level to mixer 61. The power level or noise floor 24 of the system noise for signal RF' 65 is independent of the input levels of mixer 61. As previously discussed, however, the C/N ratio decreases as the input level to the mixer is decreased. Moreover, the absolute noise floor increases with the post-mixer gain (achieved using amplifier 55) required by the lower output level. Because the broadband noise of a broadband composite signal is cumulative as the signals are summed, the noise level for a single channel is multiplied by the number of channels n, making it extremely difficult to meet the aggregate C/N ratio for RF$_{BB}$ 34 as specified for the system.

To meet the aggregate C/N specification, prior art systems often employ a switched bank 69 of m switched band-pass filters 53 that essentially divides the RF channel frequency range 14 into m frequency ranges, each encompassing multiple contiguous channels within their respective pass-bands. The typical number of filters used is between six and eight to divide the RF channel frequency range 14 into sub-octave groups of channels. The channel processor 30 selects the appropriate one of the six to eight filters 53 designed to pass a range of frequencies that encompasses the frequency band 12 to which the channel processor is assigned. Thus, each of the channel processors 30 must switchably select, in accordance with its assigned frequency channel, a final band-pass filter 53 through which the normalized RF$_N$ signal 57 is filtered to attenuate broadband noise falling outside of the pass-band of the filter. In this way, when the signals are summed to form RF$_{BB}$ 34 of FIG. 3, the channels falling inside of the pass-band of the filter will receive significantly attenuated noise contributions from the channels falling outside of the pass-band. Thus, when all of the channels of the system are combined into composite signal RF$_{BB}$ 34, the cumulative broadband noise will fall below the aggregate C/N performance specification of –65 dB for the system.

This solution is expensive because to maintain agility, each of the channel processors 30 must have all of the switched band-pass filters and must also have the mechanism by which to select and switch in the appropriate filter, in accordance with the processor's channel assignment. Moreover, as the performance level demanded by multichannel systems continues to increase, it will be more difficult for these switched band-pass filters to provide sufficient attenuation by which to meet the composite noise performance specifications. Additionally, there must be sufficient amplification of the RF$_N$ output signal 57 not only to overcome the lower input levels as previously discussed, but also to overcome the insertion losses associated with the bank of band-pass filters 69. Finally, such an amplifier must be able to accomplish this amplification with low distortion, which is expensive and consumes a considerable amount of power.

A prior art implementation of an amplifier (55, FIG. 6a) typically employed in this context is illustrated in FIG. 14. The amplifier employs a well-known push-pull topology that cancels out second-order distortion terms generated by amplifiers 400 and 402.

Thus, there is room in the art for an agile method and apparatus for up-converting modulated base-band signals to RF frequencies to produce a broadband composite signal that sufficiently attenuates undesirable distortion components in the composite signal to meet and preferably exceed the aggregate C/D specification for the system, while reducing the broadband noise of the composite signal to meet and preferably to exceed the aggregate system C/N specification without the need for large numbers of costly switched filters and power-hungry amplifiers.

SUMMARY OF THE INVENTION

It is one objective of the method and apparatus of the present invention to provide improved aggregate carrier-to-noise (C/N) and carrier-to-distortion (C/D) performance in multichannel broadband systems, by attenuating system noise at the expense of increasing distortion components levels in those cases where the distortion components can be filtered, while sacrificing system noise reduction for only those limited cases where such distortion components cannot be filtered.

It is further an objective of the present invention to reduce the number of switched filters typically employed in prior art frequency conversion methods and apparatus, and to reduce the cost and power consumption of amplifiers required to produce the requisite RF output levels for the broadband signal.

It is still further an objective of the present invention to provide a flexible means by which to optimize the system noise attenuation on a channel-by-channel basis, to the extent that the output levels of higher-order distortion components, which may very as a function of frequency as well as input level, do not exceed the C/D specification for the system by employing an IF-RF level exchange the rate of which is controlled on a channel-by-channel basis.

In accordance with the present invention, the foregoing and other objectives are achieved by an improved frequency up-conversion method and apparatus employing a novel and non-obvious IF-RF power level exchange concept. The IF-RF level exchange is employed in an otherwise well-known two-stage frequency conversion process whereby an IF attenuator, followed by an amplifier, provides adjustable gain to the composite IF output component of the first conversion stage to a level that substantially exceeds the levels commonly employed in the prior art. This pre-mixer amplification of the IF signal component results in an increase in the power level of the converted RF output signal, but does not result in an increase in the system noise power generated during the conversion. Thus, the ratio between the carrier signal and the noise floor (C/N) is increased by the amount of the gain.

Post-mixer, the RF output is then attenuated using a second RF attenuator to substantially offset the pre-mixer gain and to achieve a normalized RF output level, while maintaining the increase in the C/N ratio. Because the noise floor did not experience a level increase as a result of the pre-mixer amplification of the IF signal level, the attenuation of the output signal by the post-mixer RF attenuator reduces the noise floor by a factor substantially equal to the pre-mixer gain while maintaining a normalized RF output level. Thus, the aggregate C/N for the broadband signal is substantially improved.

Because the output levels of some higher-order distortion components generated by the mixer increase non-linearly with respect to the gain of the IF input level (e.g. at twice the rate for second-order distortion components), the post-mixer attenuator cannot restore the output levels of these distortion components to what they would have been had there been no pre-mixer gain. In CATV systems, the output level of two second-order distortion components increases at twice the rate as the desired RF output signal. As a result, using the IF-RF level exchange leaves the levels of these distortion components at higher levels than they would have had with no premixing amplification of the input levels, and significantly worsens the C/D ratio. The method and apparatus of the present invention employs, in the general case, tunable notch filters by which to attenuate these higher order distortion components, except for when their frequency is too close in proximity to the desired output signal. The present invention identifies such cases and simply sets the pre-mixing gain and post-mixer attenuation to a nominal level that constrains the IF input level of the circuit to ensure that the distortion components do not exceed the specified C/D ratio, as is done in prior art up-converters.

Because third-order components increase at a rate of 3 times the rate of the desired RF output signal, they can quickly become problematic as the pre-mixer gain is increased. Thus, there is an upper limit to the amount of pre-mixer gain that may be applied during the IF-RF level exchange. Moreover, the initial power levels of these distortion components, such as the third harmonic and inter-modulation products, are also frequency dependent. Thus, the upper limit on the exchange rate can very with frequency (i.e. on a channel-by-channel basis). The method and apparatus of the present invention includes a memory and control means (e.g. a microcontroller with associated memory) by which optimal exchange rate parameters are stored and provided to the pre-mixer attenuator to optimize the noise attenuation on a channel-by channel basis. Moreover, these parameters may be statically determined and provided during manufacturing, or they may be optimized during product test to compensate for variations in component values that occur due to manufacturing tolerances.

For the general case, the preferred embodiment employs one or more notch filters that are coupled in series (one for each distortion component to be filtered), each one capable of tracking one of the second-order distortion components. For those cases where a distortion component is too close in frequency to the RF signal of interest, the notches are tuned away from the signal of interest and parked until needed again, and the IF-RF level exchange is not performed using a nominal rate of about 1 (i.e. no level exchange). To increase the tuning range of these notch filters beyond 1.5 octaves each, additional notch filters can be coupled in series with different tuning ranges. One alternate embodiment would be to use filters having switchable reactive components by which to vary the tuning range of the filters. A third alternate embodiment would be to employ switched banks of notch filters, with each bank comprising the one or more notch filters in series for each distortion component to be filtered. The notch filters of each bank for covering a different portion of the tuning range.

For application to a CATV system, the preferred embodiment employs three switched filter banks, a first one for filtering signals assigned to channels in the range of 50 MHz to 165 MHz, a second bank for filtering signals assigned to channels in the range of 165 MHz to 500 MHz, and a third bank for filtering up-converted signals in the range of 500 MHz to 870 MHz. The first bank comprises a low-pass filter having a cutoff frequency of 165 MHz, and a tunable notch embedded in the low-pass that tracks the second-harmonic component between 100 MHz and 330 MHz. The second bank comprises a low-pass filter with a 500 MHz cutoff frequency, and a tunable notch filter that tracks the second harmonic component in the range of 330 MHz and 1000 MHz. The third bank comprises a single high-pass filter having a cutoff frequency of 500 MHz.

One preferred embodiment of the tunable notch filters of the present invention employs a pair of varactors in a back-to-back configuration that is coupled in parallel with an inductance. The voltage across the varactors can be adjusted to vary the capacitance that is in parallel with the inductance to tune the filter to the frequency of the distortion components. The back-to-back configuration of the varactors tends to offset or eliminate first-order non-linearity in the transfer function of the notch filters caused by the non-linear characteristic of varactors. In a second preferred embodiment of the notch filter of the present invention, two or more of the varactor circuits are placed in parallel with one another. This decreases the parasitic elements associated with the varactors, thereby increasing the unloaded Q (and therefore the notch depth of the filter) and decreases insertion loss. Another alternate preferred embodiment is to combine the tunable notches with low-pass, band-pass or high-pass filters when such a combination is optimal.

Finally, an RF amplifier for achieving the requisite output levels is employed by the present invention that is a patentable improvement over the prior art. The amplifier incorporates any of the foregoing notch embodiments, permitting the notches to attenuate distortion generated by the amplifier and permitting the notches to operate at reduced input levels, thereby reducing the distortion generated by the notches.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE INVENTION

Figure 6A:
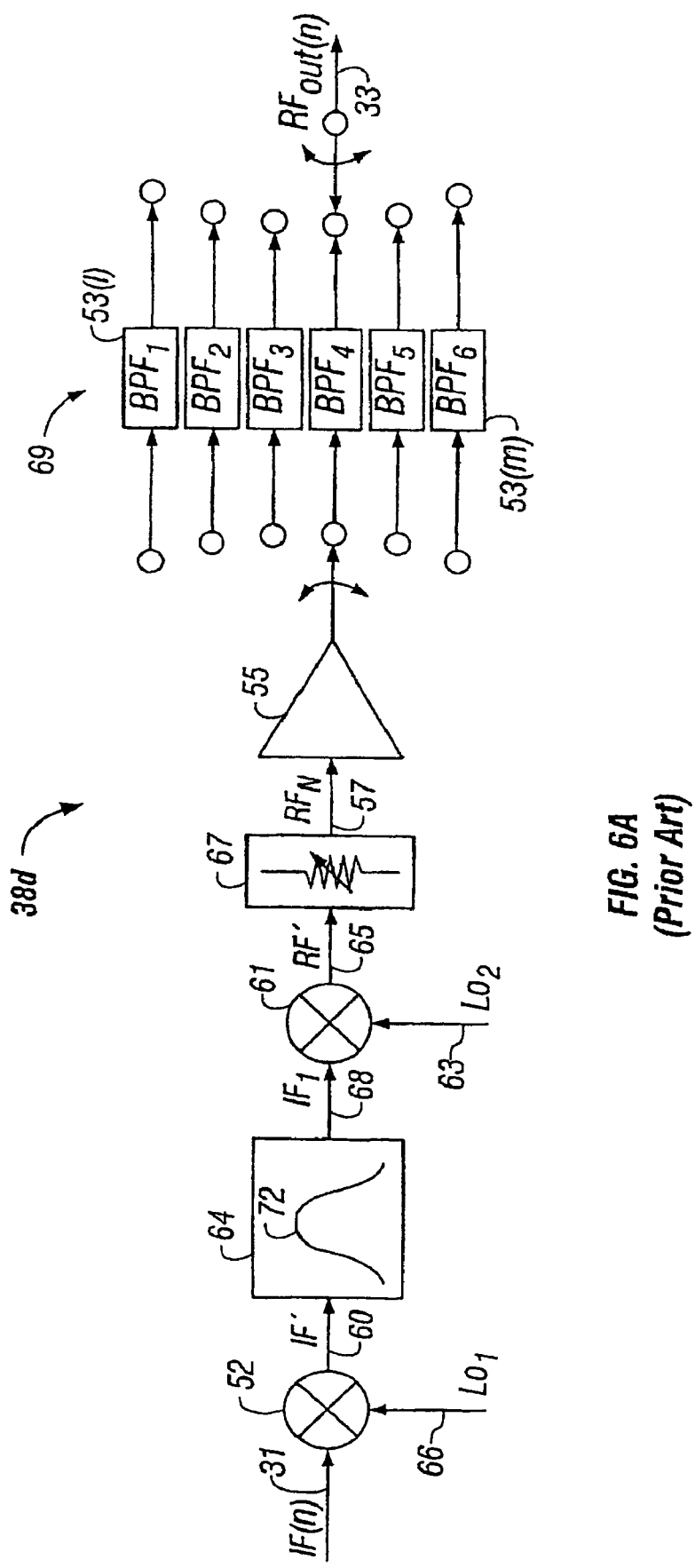
FIG. 6a is a conceptual representation of a prior art two-stage frequency converter
Figure 6B:
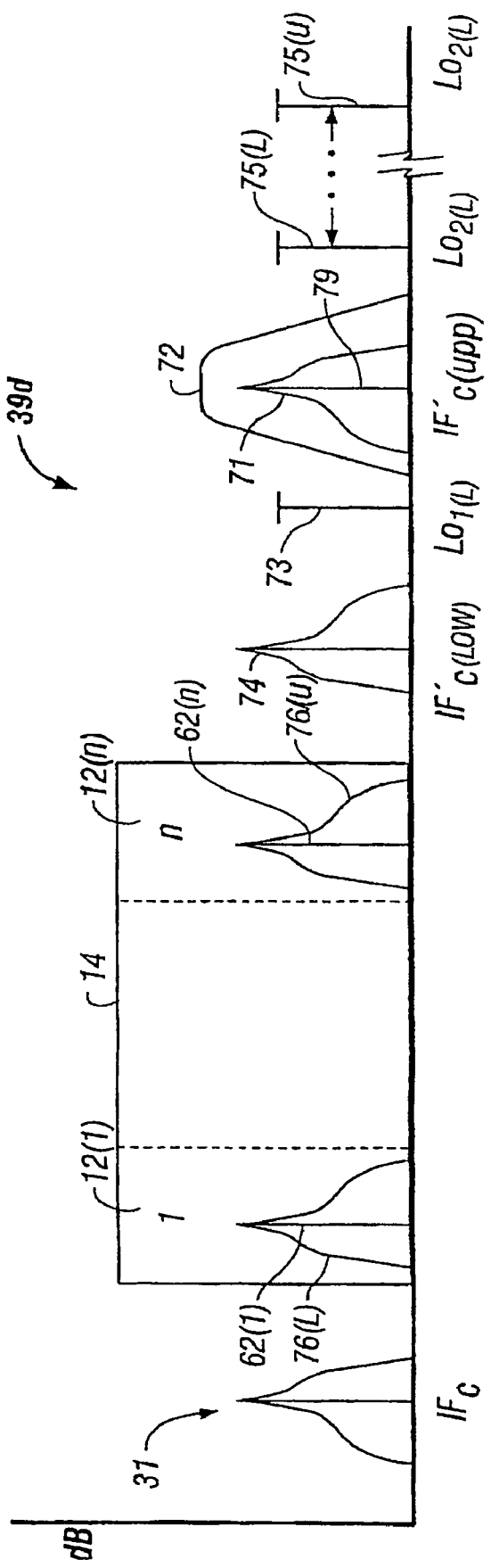
FIG. 6b is a conceptual representation of converted intermediate IF (first stage) and RF (second stage) output signals and their constituent components generated by the two-stage converter of FIG. 6a of the prior art.
Figure 7A:
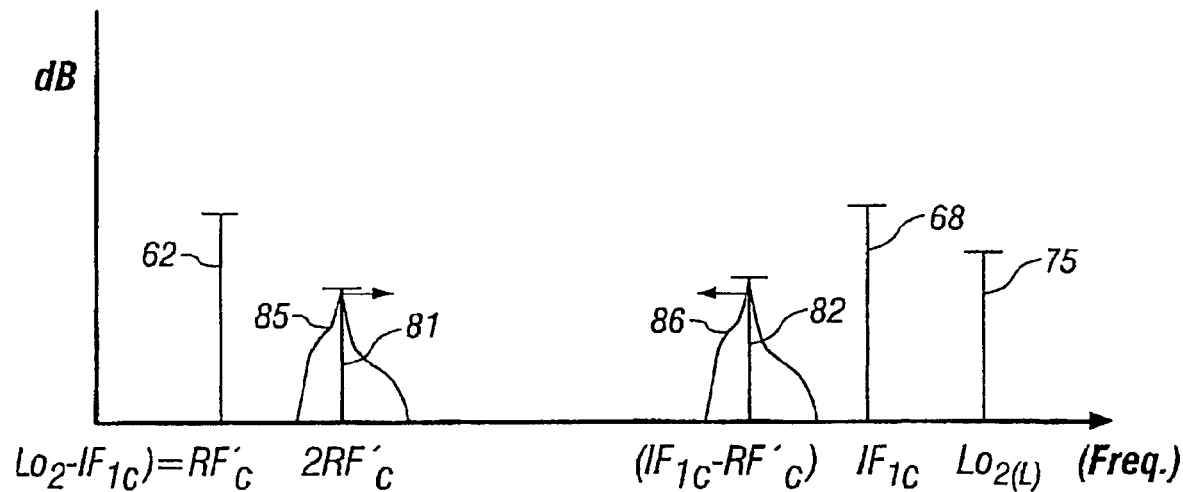
FIG. 7a is a conceptual representation of second-order distortion components that are generated by the conversion performed by the frequency converter of FIG. 6a of the prior art.
Figure 7B:
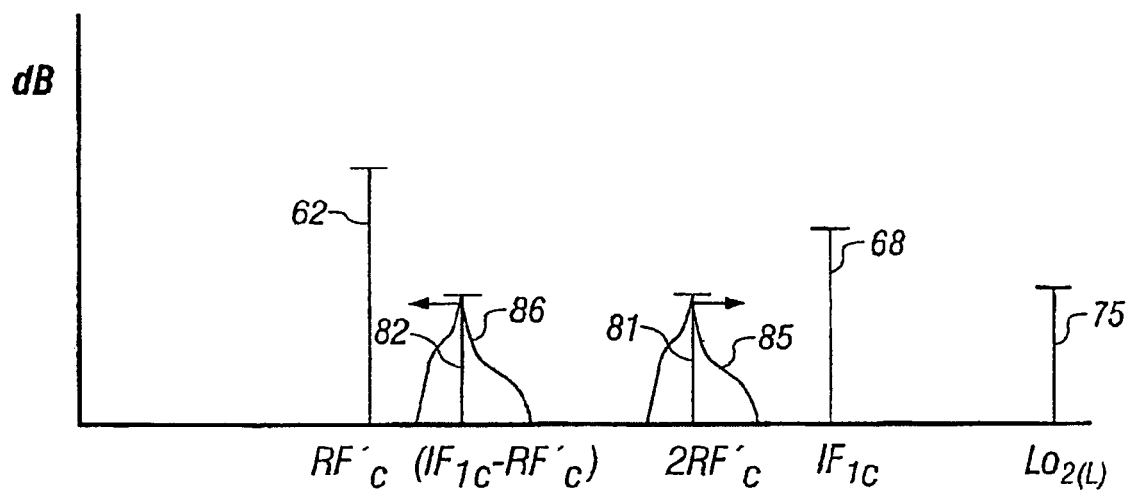
FIG. 7b is a conceptual representation of the second-order distortion components wherein one of the distortion components is too close in proximity to the converted RF channel component to be filtered without affecting the desired RF output signal of the prior art.

As previously discussed, the prior art up-converter meets the C/D specification by constraining the input levels to the second mixer of the two-stage frequency converter to guarantee that all distortion components for every channel in the RF channel frequency range is a minimum of 65 dB down from the level of the converted output signal components. This technique, however, meets the C/D ratio at the expense of the C/N ratio, which must be met using a bank of switched band-filters after this mixing process. Not only is a bank of 6 to 8 band-pass filters costly and cumbersome, they also place additional burden on the output RF amplifier used to achieve the requisite output levels for the system. The RF amplifier must have sufficient gain to overcome the insertion losses created by the band-pass filters, and must do so with a minimum level of distortion. Moreover, the band-pass filters must also perform with a minimum level of distortion. The method and apparatus of the present invention reduces the number of post-mixer filters, and significantly reduces the burden on the RF output amplifier, while achieving as good or better noise and distortion performance than that of the prior art two-stage converter (FIG. 6a). Further, a significant reduction in power dissipation of an up-converter is also realized.

The present invention accomplishes this result by reversing the prior art approach and optimizing the C/N ratio on a channel-by-channel basis for all frequencies in which the predominant distortion components are capable of being filtered using conventional filters, tunable notches or a combination thereof. The limitations on this optimization will be channel specific, depending upon the point at which distortion components threaten the C/D specification, which either cannot be filtered without degrading the signal of interest, or which are not worth filtering in view of the noise performance already achieved. In the case of the exemplary CATV application, two second-order distortion components become predominant first as a function of the input level to the second mixer. One of these components cannot be filtered at certain channel frequencies and for those frequencies the C/N will be sacrificed for C/D to the extent necessary to meet the C/D specification for the system. For those channel frequencies where this distortion component can be filtered, C/N may be optimized until certain third-order components begin to predominate. While one could filter these as well, by the time these components threaten to exceed the C/D specification, practically speaking, the C/N for the channel has been sufficiently optimized and additional filtering of such distortion components does not present a return that is worth the additional circuit complexity. Further, because the level of these third-order components are also frequency dependent, the degree of C/N optimization will also vary on a channel-by-channel basis.

The channel-by-channel optimization of the C/N ratio is accomplished through an IF-RF level exchange that is applied to the otherwise known up-converters of the prior art. This level exchange is performed by applying a variable pre-mixer gain and post-mixer attenuation to the second stage of the dual converter of the prior art. Applying the pre-mixer gain increases the output level of the RF signal of interest with respect to the output noise power, thereby increasing the C/N ratio. The post mixer attenuation is substantially equal to the pre-mixer gain, and attenuates the RF signal of interest to an expected output level, while reducing the noise power level by the amount of the attenuation, thereby maintaining the improved C/N ratio. Because second-order distortion components increase at a rate that is twice the rate of the RF output signal of interest as a function of input level to the mixer, however, the second order distortion component levels are left higher with respect to the RF output signal of interest, and thus even after the attenuation, the C/D ratio has been worsened. Thus, they must be capable of being filtered in order to accomplish the improvement in the C/N ratio without failing the C/D specification.

For those channel frequencies for which the distortion components can be filtered, the rate of exchange will depend on the levels of third-order distortion components, but will be significantly greater than one. For those channel frequencies where one or more of the second-order components cannot be filtered, the level exchange rate will be closer to one (i.e. no level exchange), as referenced to those input levels used on the prior art to achieve the C/D specification. Even though there will be some channels where virtually no level exchange will take place, the method and apparatus of the present invention is so efficient in the attenuation of system noise for those channel frequencies where filtering distortion components is viable, overall aggregate system noise performance is still significantly improved over the prior art.

Figure 8:
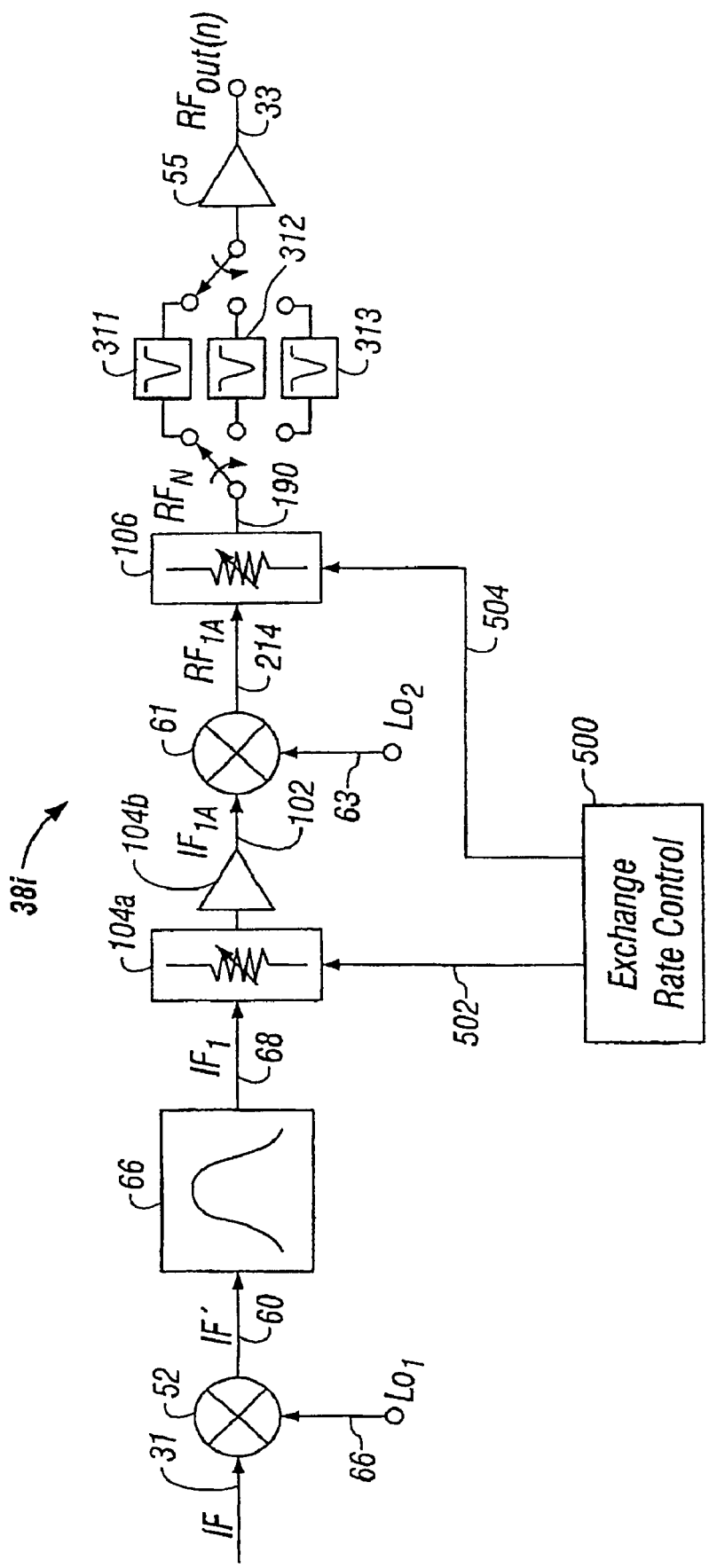
FIG. 8 is a conceptual representation of the two-stage frequency converter of the present invention employing an IF-RF level exchange and tunable notch filters to eliminate distortion components.

With reference to FIG. 8, the up-converter 38$i$ method and apparatus of the present invention is now described. First, the present invention adds an additional IF attenuator circuit 104$a$ to the two-stage up-converter of the prior art. Those of skill in the art will recognize that the IF attenuator 104$a$ is actually the means by which the pre-mixer gain is controlled in conjunction with the fixed gain provided by the accompanying IF amplifier 104$b$. An exchange rate control and memory 500 is used to store the parameters for optimal exchange rate for each channel frequency, as well as to provide control output 502 to attenuator 104$a$ and control output 504 to control the amount of attenuation provided by attenuator 106. The exchange rate control 500 is preferably implemented using a microcontroller with associated memory in which to store the optimal exchange rate parameters for each channel frequency.

For those channel frequencies for which the dominant distortion components are capable of being filtered, the input power level of the composite signal $IF_1$ 68 is first amplified by decreasing the attenuation provided by IF attenuator circuit 104$a$, thereby increasing the total gain between $IF_1$ 68 and the input signal $IF_{1A}$ 102. This in turn provides a commensurate increase in the output power level of the components of composite output signal $RF_{1A}$ 214. This increase in the power level of the $RF_{1A}$ output signal 214 relative to the system or broadband noise floor 24; the broadband or system noise 22 generated during the conversion process is unrelated to the $IF_{1A}$ 102 signal level. RF attenuator 106 then attenuates the level of the entire composite $RF_{1A}$ signal by a factor substantially equal to the gain provided by the pre-mixer attenuator 104$a$ and amplifier 104$b$. The post-mixer RF attenuator 106 attenuates all of the components of $RF_{1A}$ output signal 214, including the broadband noise 22 and the second-order distortion components. Because the noise power level did not increase with the pre-mixing amplification, the noise power level 24 is reduced by a factor substantially equal to the pre-mixer gain by RF attenuator 106. Because the power levels of the second-order distortion components increase at twice the rate of the signal of interest $RF_{1A}$ 214 as they are mixed with local oscillator signal $L_{O2}$ 63 by mixer 61, the power levels of the dominant second-order components of $RF_N$ 190 are greater relative to $RF_{1A}$ 214 then in the case without pre-mixing amplification. Thus, the C/D has been lowered and probably fails the system specification, but because the component can be filtered, the C/N can be so optimized for this channel frequency.

Figure 9A:
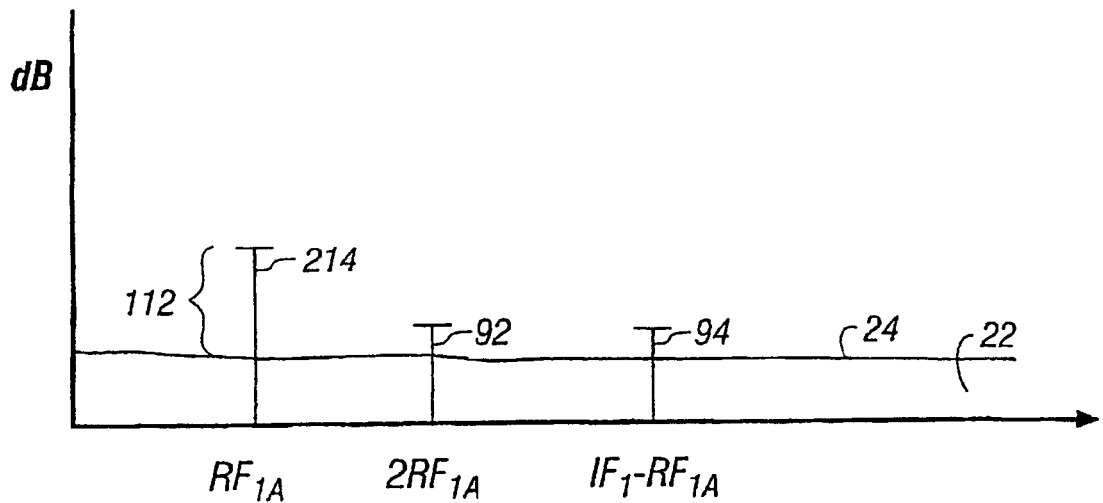
FIG. 9a is a conceptual representation of the desired RF signal component and the unwanted second-order distortion components generated by the frequency converter of the present invention as applied to the exemplary CATV application, where the channel frequency is at the low-end of the channel frequency range.
Figure 9B:
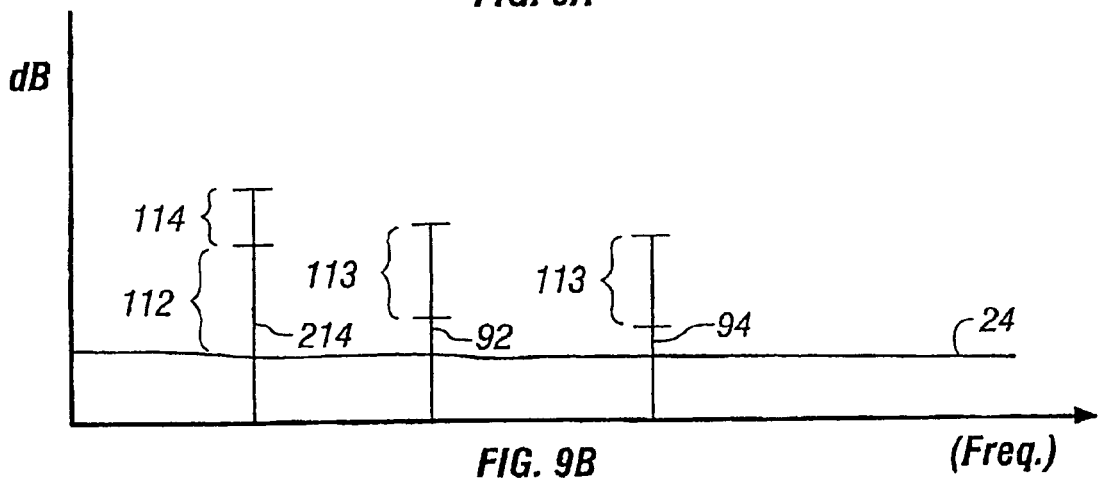
FIG. 9b is a conceptual representation of the amplification of the desired RF signal component and the system noise component of the output generated by the frequency converter of the present invention when using the IF-RF exchange process of the present invention.
Figure 9C:
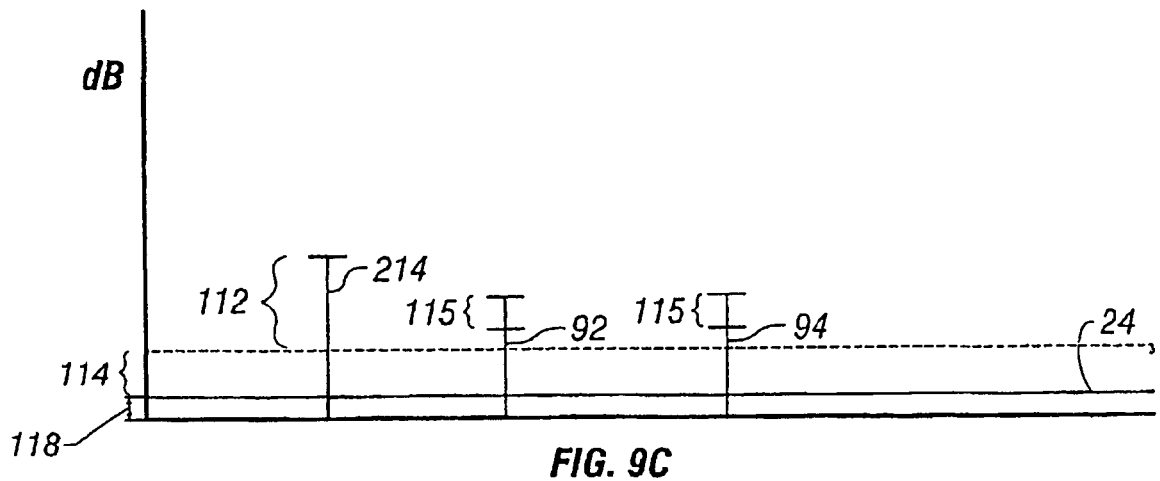
FIG. 9c is a conceptual representation of the desired RF signal component and the system noise component of the output of the frequency converter of the present invention after the attenuation step of the IF-RF exchange process has been employed.

The result of this IF-RF exchange is illustrated in FIGS. 9$a$-$c$. FIG. 9$a$ illustrates the comparative output levels of the $IF_1$ 68 signal at the output of mixer 61, in the case without pre-mixer amplification. The difference in the level of carrier component $RF_{1A}$ 214 of the output signal and the system noise floor 24 is illustrated by bracket 112. FIG. 9$b$ illustrates the level of RF carrier component $RF_{1A}$ 214 with pre-mixer amplification, having an increased level 114. Note that the noise floor 24 of system noise 22 resulting from the conversion remains the same as for the conversion performed without the pre-mixer amplification of $IF_1$ 68. Additionally, the power levels of second-order components 92, 94 also increase (by an amount 113), and at twice the rate of the RF carrier component $RF_{1A}$ 214. FIG. 9$c$ illustrates the power levels of the various constituents of $RF_{1A}$ after the post-mixer attenuation through attenuator 106. The post-mixer attenuator attenuates the composite RF output signal to produce a normalized output level that is substantially the level that it would have exhibited had composite signal $IF_1$ 68 not been amplified. This attenuation also attenuates system noise such that the noise floor 24 now resides at a level 118 that is less than previous level 24 by an amount that is substantially equal to difference 114. Distortion components 92, 94 retain a significant amplification of their respective power levels illustrated by magnitude 115. This is not a problem provided neither of the components are so proximate in frequency to the signal of interest, that they cannot be filtered.

For the CATV system example, the dominant distortion components are the second harmonic 92 and $IF1$-$RF_{1A}$ 94 components. Because the second harmonic is always at twice the rate of the signal of interest, it is always filterable. A previously discussed Component 94 is not. For those channels having a frequency whereby component 94 is filterable, the exchange rate can be maximized to the extent that even higher-order distortion components are not failing the C/D ratio that are also not filterable. A few examples would be the third harmonic of the signal of interest and the inter-modulation products. By the time these less dominant components achieve a level that violates the C/D for the system, however, the C/N has likely been adequately optimized and thus the exchange rate can be limited at the point the third-order components begin to threaten the C/D specification, rather than adding the expense of additional filters. Those of skill in the art will recognize, however, that the exchange rate could be increased to the point that the third-order components exceed the C/D specification, if the third components can be filtered and if the expense of additional filtering makes the additional benefit to C/N worthwhile. Whenever the conversion frequency is in a range where component 94 is not capable of being filtered, attenuator 104$a$ is simply adjusted to offset enough of the gain of amplifier 104$b$, such that the $IF_1$ 68 input power level will be low enough to guarantee that component 94 meets the system C/D and attenuator 106 is adjusted to provide nominal attenuation.

Figure 10A:
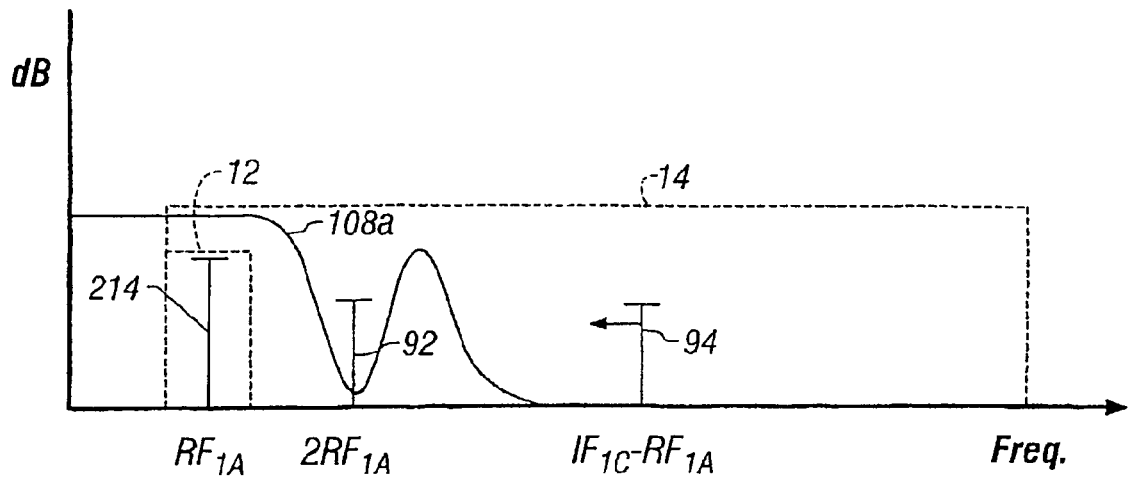
FIG. 10a is a conceptual representation of the desired RF signal component, the unwanted second-order distortion components of the exemplary CATV application, and the system noise component of the output of the frequency converter of the present invention where the desired RF channel frequency is at the low-end of the channel frequency range.
Figure 10B:
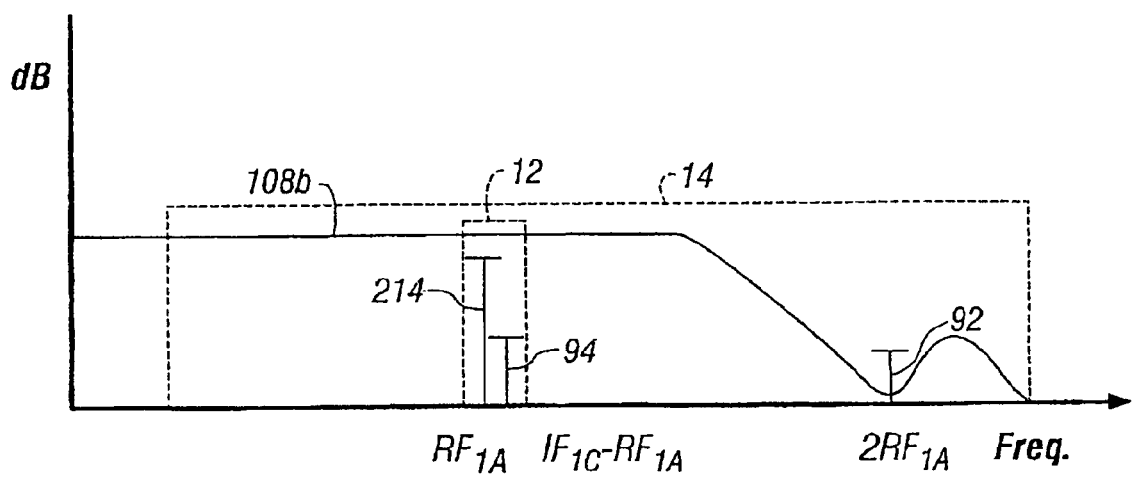
FIG. 10b is a conceptual representation of the desired RF signal component, the unwanted second-order distortion components, and the system noise component of the output of the frequency converter of the present invention, where the desired RF channel frequency is in the middle of the channel frequency range.
Figure 10C:
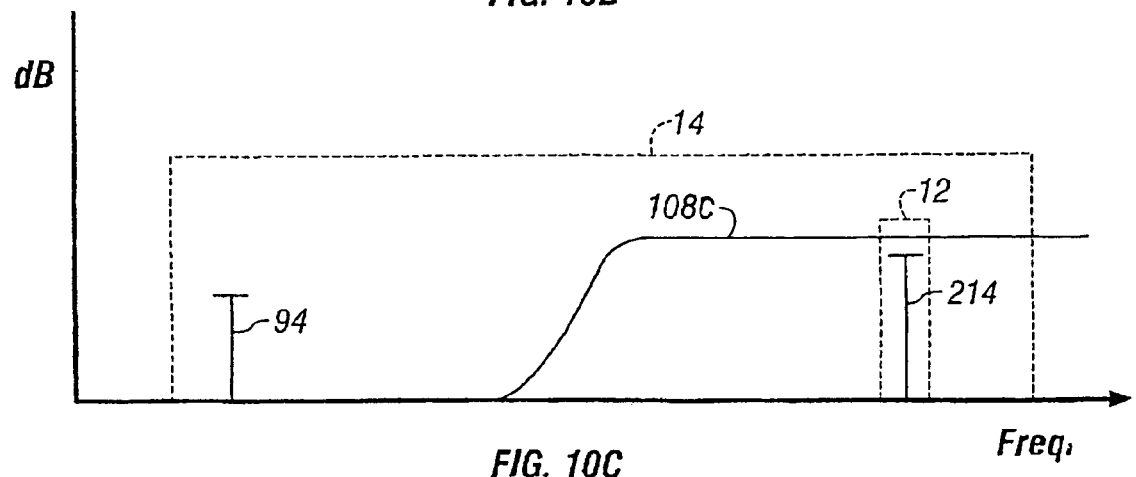
FIG. 10c is a conceptual representation of the desired RF signal component, second-order distortion components and the system noise component of the output of the frequency converter of the present invention, where the desired RF channel frequency is at the high-end of the channel frequency range.

The preferred embodiment of the present invention has three banks 311, 312, 313 of filters, by which one or both of the two components can be filtered. Each filter bank corresponds to a portion of the channel frequency range 14. With reference to FIGS. 10a-c, the three channel frequency ranges and the associated filter characteristics are conceptually illustrated. FIGS. 10a and 10c illustrate the scenarios where the up-conversion occurs for frequencies in the lower (50 to 165 MHz) and upper (500 to 870 MHz) portions of the frequency range 14 respectively. In these two scenarios, the second-order distortion components are both sufficiently distant in frequency from the signal of interest to permit them to be filtered by the notches. Thus, in these cases, the exchange rate of the IF-RF exchange can be optimized to the point where other higher-order terms threaten the C/D specification of the system. FIG. 10b illustrates the scenario where the up-conversion occurs for channel frequencies (165 MHz to 500 MHz) where distortion component 94 is too proximate to be filtered. Thus, the exchange rate can be optimized for noise only to the extent that the component 94 meets or exceeds the C/D specification for the system. For the CATV system, however, it is more practical to optimize for the C/D ratio because the amount of improvement in aggregate noise performance gained by optimizing the noise performance for these channel frequencies is outweighed by the importance of meeting the C/D specification. Thus, for these channel frequencies where the distortion component cannot be filtered, the rate of level exchange will be nominal with respect to the input power level constraints of the prior art.

In the preferred embodiment for CATV applications, the filter for bank 311 is optimized based on the nature of the distortion components to be filtered as a low-pass having a cutoff frequency at 165 MHz, with an embedded notch that is tuned to track the second harmonic at between 100 MHz and 330 MHz. The transfer function 108a for this filter is conceptually illustrated in FIG. 10a. As can be seen, the low pass always attenuates the distortion component 94, so no additional filter is needed for this range. The filter for bank 313 is a high-pass filter having a cutoff frequency at 500 MHz. The transfer function 108c is shown in FIG. 10c. From the figure it can be seen that no other filter is required for this scenario, as the second harmonic component 92 is always outside of channel frequency range 14 and distortion component 94 is always well below the cutoff for this range. For the middle bank 312, the filter is a low-pass having a cutoff frequency at 500 MHz, with an embedded notch tuned to track the second harmonic component 92 from 330 MHz to 1 GHz. The transfer function 108b of this filter is conceptually illustrated in FIG. 10b. Of course, this filter could have been made a bandpass to achieve additional rejection below the frequency range of component 94, but the additional complexity in the filter design was deemed not worth the additional rejection gained. For this channel frequency range, the distortion component 94 is too close in proximity to the signal of interest 214 to permit filtering of the component without affecting the signal of interest.

Those of skill in the art will recognize that for the general case, the preferred embodiment would employ a number of tunable notch filters in series equal to the number of distortion components that required attenuation by filtering. These notches could then be employed in banks 311, 312 and 313, or any additional number of banks required to extend the coverage over the channel frequency range of the system. The frequency range over which a tunable notch filter can be tuned for a given value of L is about 1.5 octaves. For systems such as CATV having a frequency range on the order of 4.5 octaves, additional provisions must be made by which to extend the tuning range of the notches. Thus, for CATV applications, the preferred embodiment of the present invention employs three banks of filters.

One alternative embodiment to the switched banks as applied to the general case would be to deploy the number of tunable notches equal to the number of distortion components, but provide each of the notches with switchable reactive elements that can alter the characteristic of the tunable notches to provide multiple tuning ranges for the same circuit. Finally, and probably the least desirable, another alternative to the switched banks would be to concatenate in series the total number of tunable notches required, each with having a set tuning range and engaging those notches that have a tuning range that falls within the requisite channel frequency range.

Those of skill in the art will recognize that for a given system, such as that illustrated herein for a CATV system, there are many possible ways of optimizing the combination and types of filters used, depending upon the nature of the components to be filtered. The general case is illustrated for purposes of illustrating the wide applicability of the present invention to any such system having any number and type of distortion components to filter.

Figure 11A:
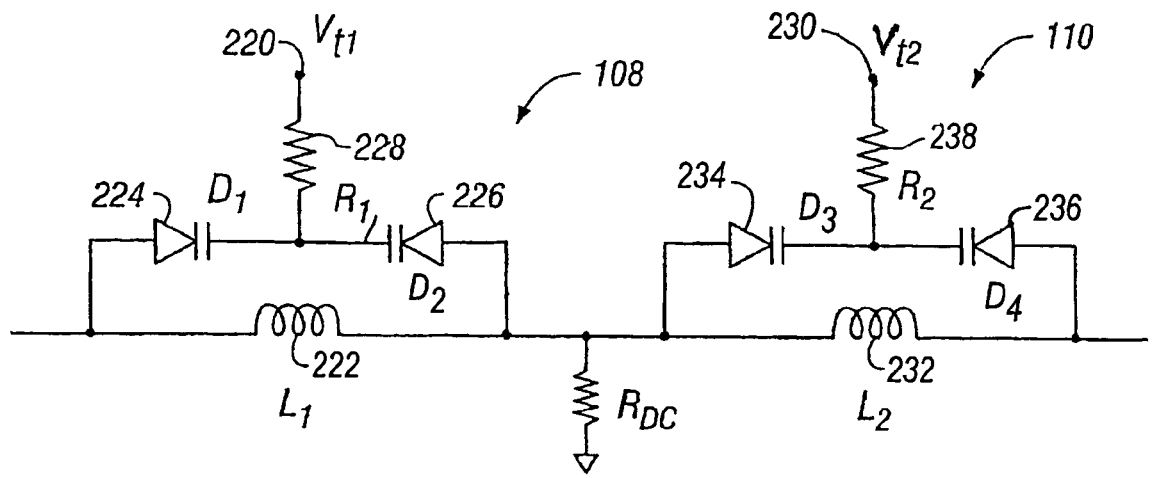
FIG. 11a is a circuit representation of a back-to-back embodiment of the two tunable notch filters of the present invention connected in series.
Figure 11B:
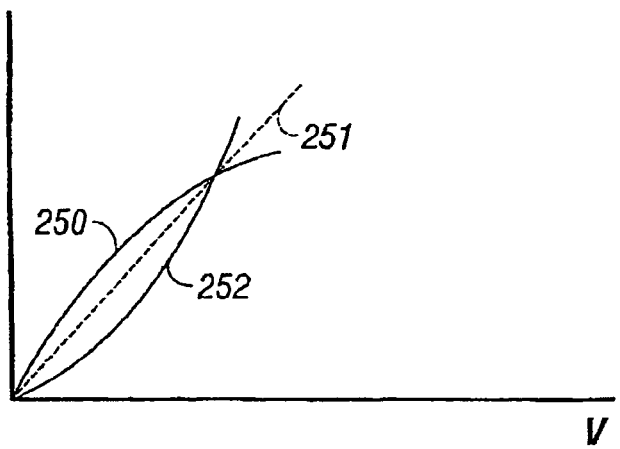
FIG. 11b is a conceptual representation of the responses of the two varactors as connected in a back-to-back configuration.
Figure 11C:
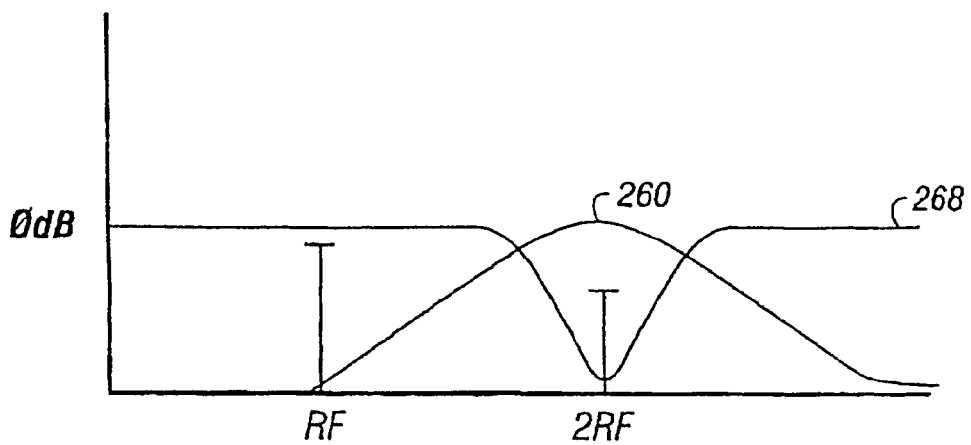
FIG. 11c is a conceptual representation of the transfer function of the notch filter in relationship to the voltage across the varactors of the present invention.

One possible embodiment of the tunable notch filters for the general case is now described with respect to FIG. 11a. Each notch filter 110, 108 is made up of a pair of varactors $D_1$ 224, $D_2$ 226 and $D_3$ 234, $D_4$ 236 respectively. Each pair of varactors is connected in a back-to-back configuration, and in parallel with an inductance $L_1$ 222 and $L_2$ 232 respectively. The varactors act as variable capacitors, their capacitance a function of the voltage across them. Because of the back-to-back configuration, the first-order non-linear characteristics 250, 252 of each varactor in the pairs 224, 226 and 234, 236, respectively, cancel each other out to produce a response more like 251 as illustrated in FIG. 11b. By varying the tuning voltage $V_{T1}$ 220 and $V_{T2}$ 230 of each notch filter, the capacitance of the varactors can be tuned with the inductors $L_1$ 222, $L_2$ 232 respectively such that the voltage across the varactors is at a minimum at the RF channel carrier frequency, and at a maximum at the fundamental frequencies of the distortion component. This voltage/frequency characteristic 260 is illustrated in FIG. 11c for the second harmonic of the RF channel frequency component, along with the resulting transfer function 268 of the notch filter.

Figure 12:
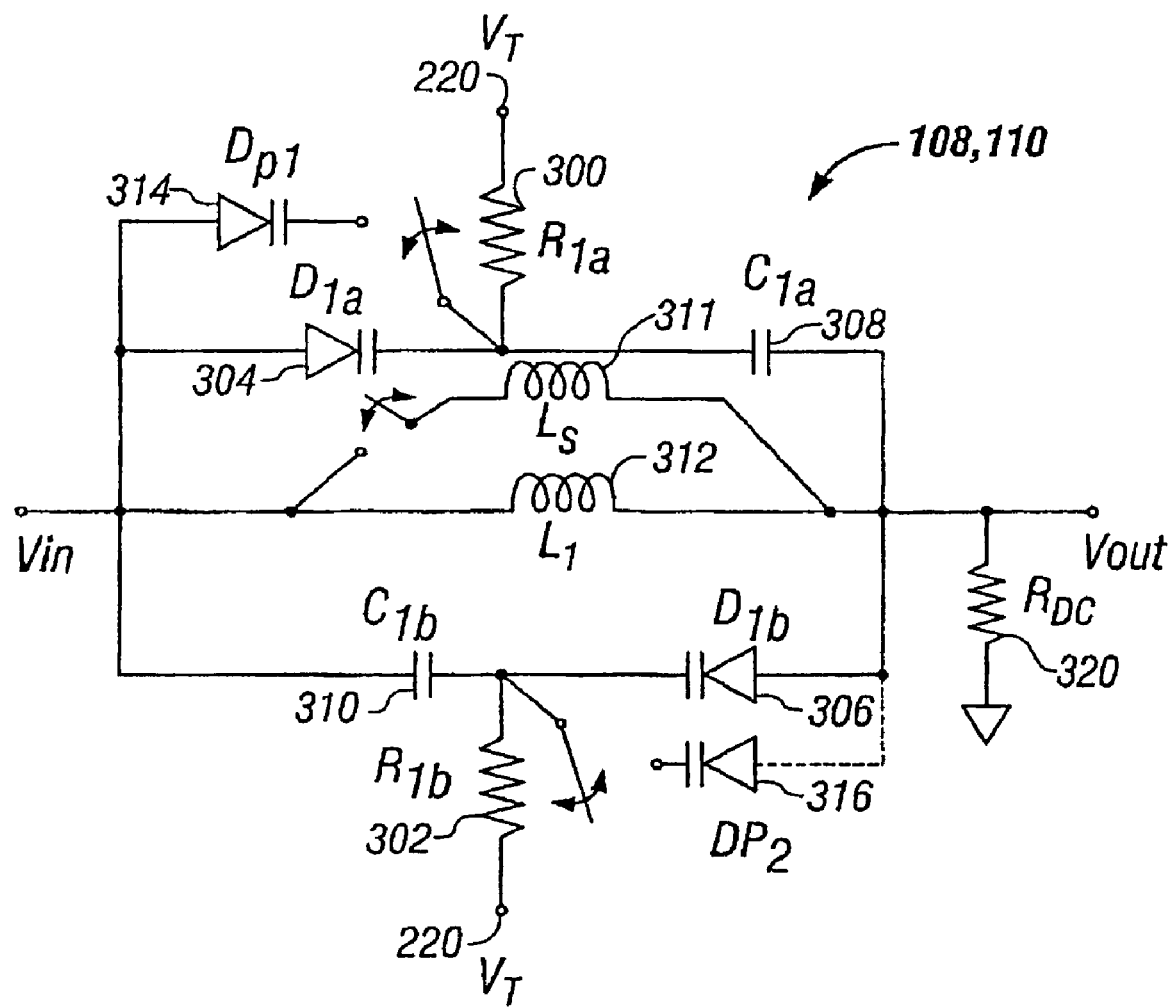
FIG. 12 is a circuit representation of a parallel implementation of the tunable notch filter of the present invention, with optional switched components by which to extend the tuning range of the filter.

One problem with the embodiment of the notch filter as illustrated in FIG. 11a is that because the varactors are in series with one another, their parasitic resistance and inductance components are also in series and are therefore additive. Further, the capacitance values supplied by the varactors are divided in half. Thus, the unloaded Q of the notch filter is reduced and along with it the notch depth of the frequency response. An improved embodiment of the tunable notch filters 108, 110 is illustrated in FIG. 12. In this preferred embodiment, the varactors $D_{1a}$ 304, $D_{1b}$ 306 are still coupled so that the signal paths through the varactors oppose, thereby producing the beneficial canceling of non-linearity as illustrated in FIG. 11b, but they are now in parallel with one another. As a result, the parasitic resistance and inductance components of the varactors are now in parallel and their values are therefore reduced, while the capacitance values of the varactors are additive. This increases the unloaded Q for the notch, which serves to deepen the notch, while the signal losses in the pass-band due to the parasitic components are minimized.

By adding one or more additional varactors $D_{P1}$ 314, $D_{P2}$ 316 that can be switched in and out in parallel with one another, and additional inductor values LS that can also be switched in and out, the tuning range of the circuit can be extended to the point that the three switched banks can be eliminated. Capacitors $C_{1a}$ 308 and $C_{1b}$ 310 are DC blocking capacitors to prevent short-circuiting of the tuning voltage VT, which returns to ground through resistors $R_{1a}$ 300, $R_{1b}$ 302 and $R_{DC}$ 320.

Figure 13:
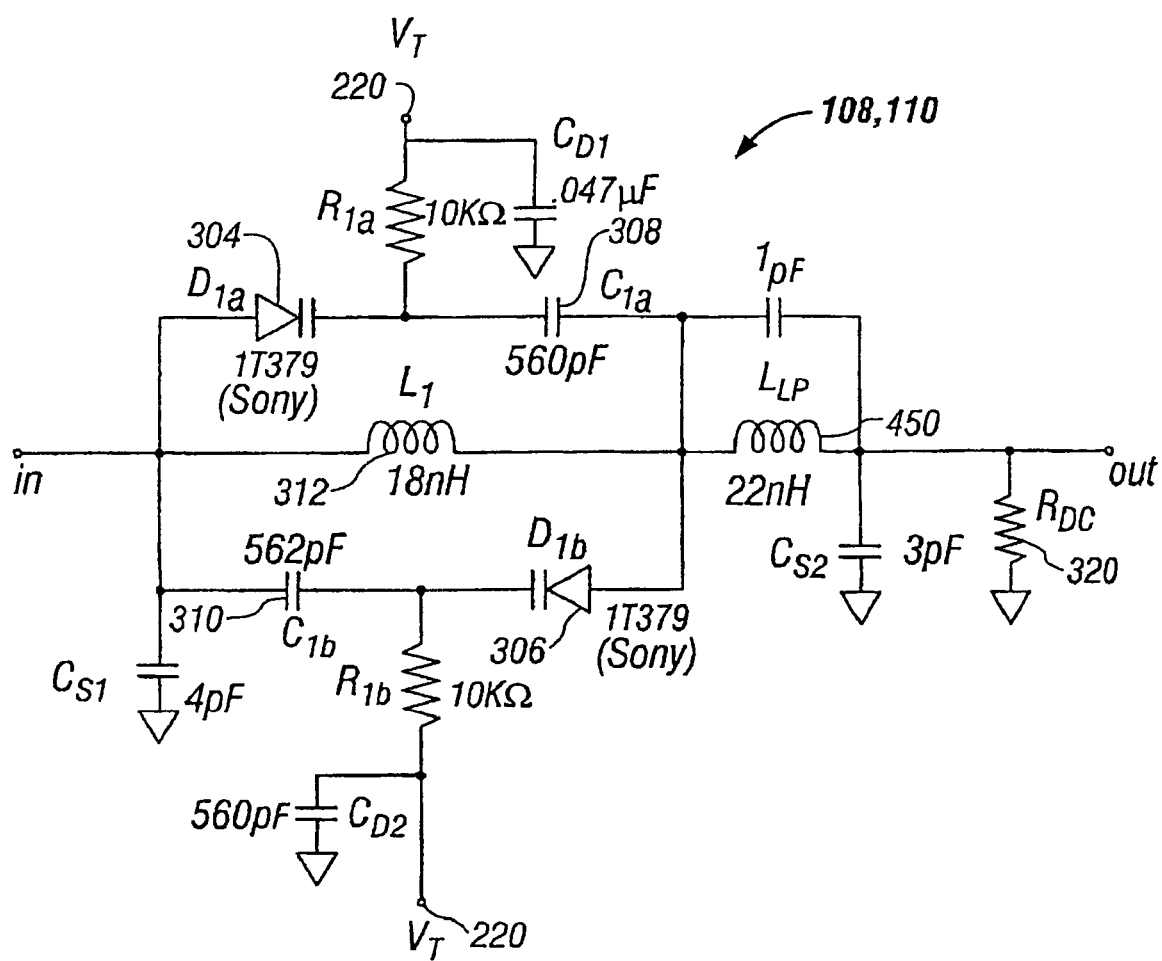
FIG. 13 is a circuit implementation of the tunable notch filter of the present invention that has been embedded within a low-pass filter.

A further enhancement of the preferred embodiment of the tunable notch filter is illustrated in FIG. 13, wherein the tunable notch topology of FIG. 12 is embedded within a low-pass filter, the benefits of which were discussed above. This circuit topology is the one used for filter banks 311 and 312, with values that are used to produce the characteristic 108b of FIG. 10b for bank 312.

These filters are simple and reasonably linear despite their tunable nature. The IF-RF exchange in combination with the notch filters serves the purpose of eliminating the distortion components to make the IF-RF exchange optimal for two of the three output scenarios. This enables the multichannel system of FIG. 3 to generate a composite broadband signal that meets both the C/N and C/D specifications for the system without need for the large number of switched filters of the prior art. The prior art switched filter scheme is complex and produces a high loss (as much as 3 dB) to the output that must be compensated by use of an RF amplifier that dissipates considerable power.

Figure 1:
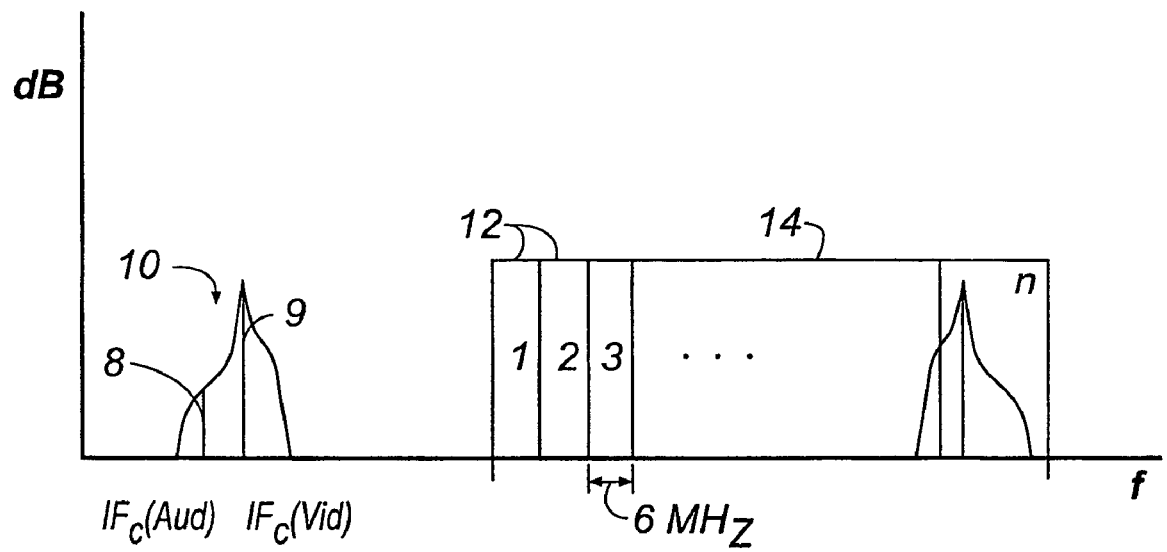
FIG. 1 is a conceptual representation of a base-band modulated composite IF signal that is to be up-converted to one of n RF channels of the prior art.
Figure 2:
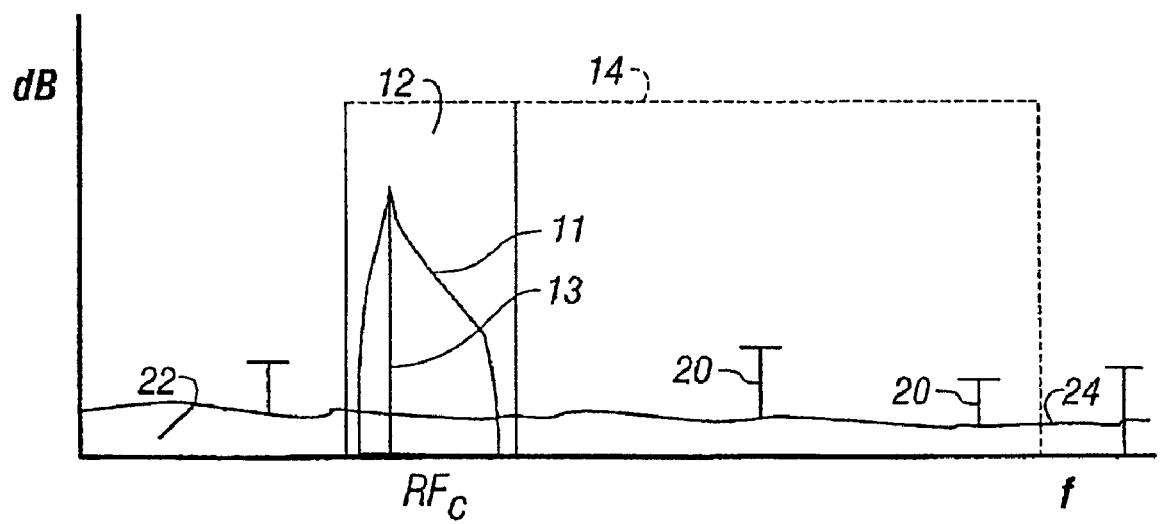
FIG. 2 is a conceptual representation of an up-converted base-band modulated composite IF signal to one of n RF channels, along with system noise and distortion components generated by the conversion process of the prior art.
Figure 3:
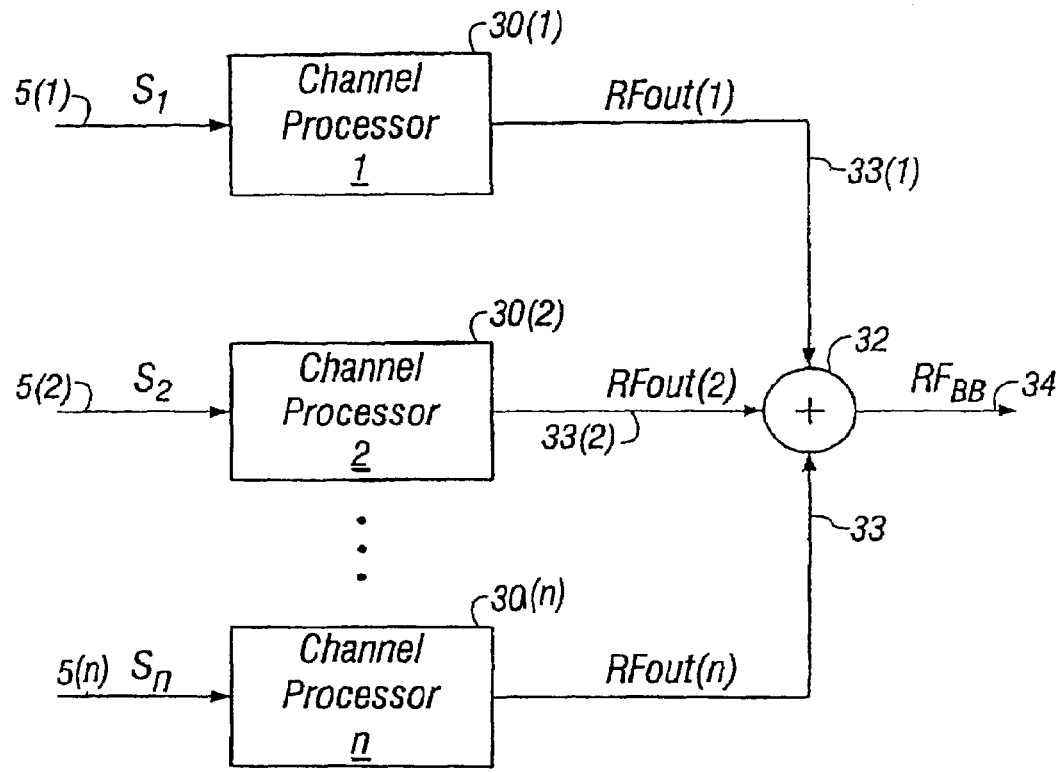
FIG. 3 is a conceptual representation of a system of channel processors for producing a composite broadband multichannel signal from n base-band signals of the prior art.
Figure 4:
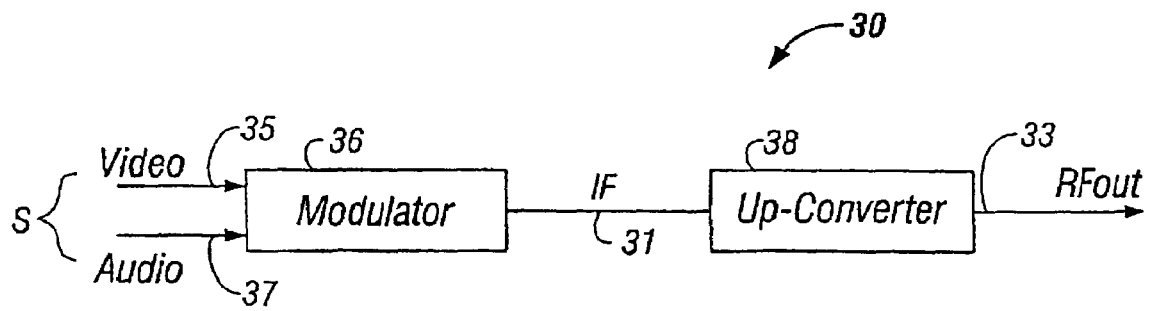
FIG. 4 is a conceptual representation of one of the channel processors of FIG. 3 for performing frequency conversion of a base-band signal to an RF channel of the prior art.
Figure 5A:
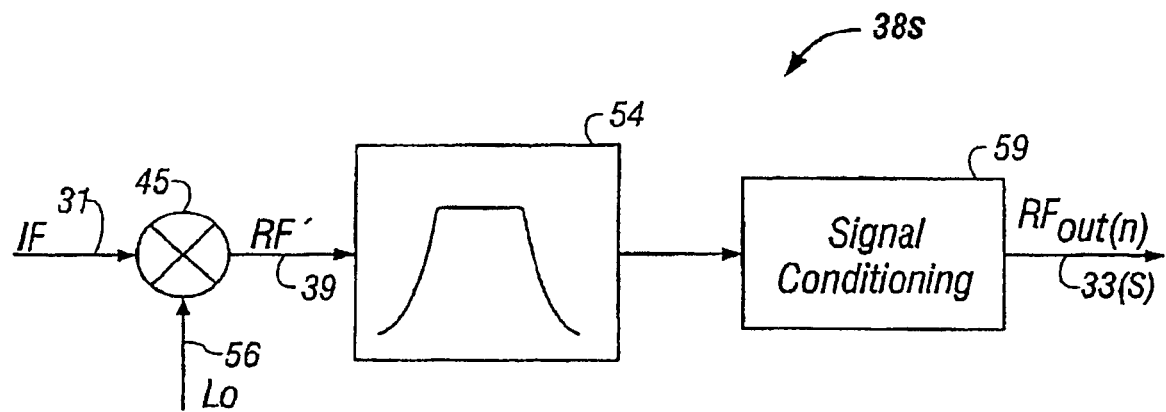
FIG. 5a is a conceptual representation of a single-stage frequency up-converter of the prior art.
Figure 5B:
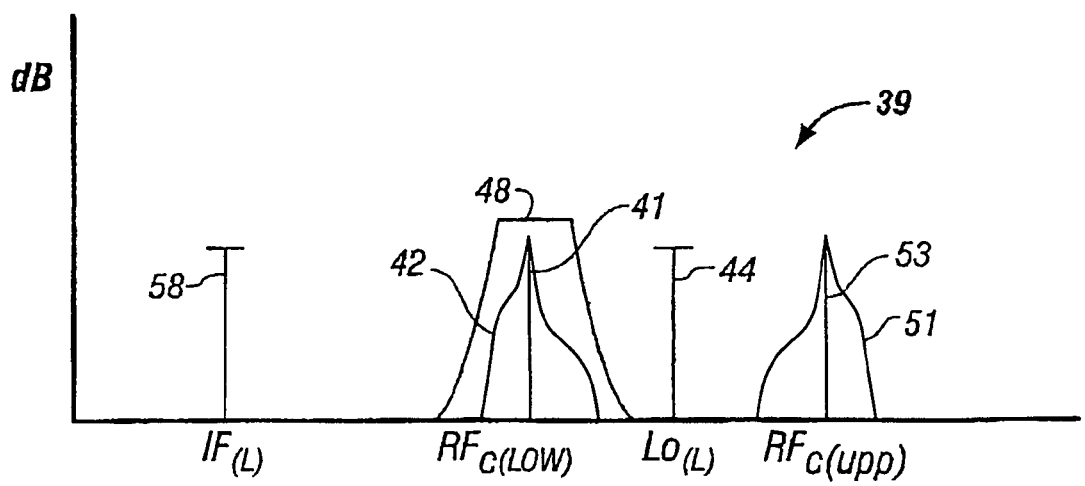
FIG. 5b is a conceptual representation of a converted RF output signal and its associated side-band and leakage components generated by the converter of FIG. 5a of the prior art.
Figure 14:
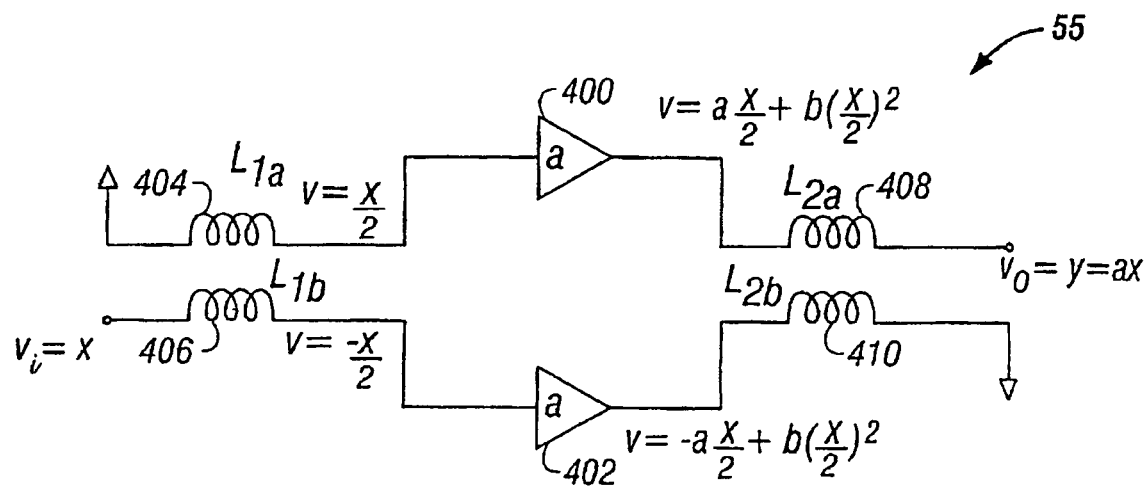
FIG. 14 is an RF amplifier of the prior art having a push-pull circuit topology.

Typically, in a multichannel system such as that of FIG. 3, the RF output signal is amplified using a broadband amplifier 55 before distribution (FIG. 6a). In the present invention, this amplifier could be placed before, or after the filter banks 311, 312 and 313 as shown in FIG. 8. A prior art implementation of amplifier 55 is illustrated in FIG. 14. Amplifier 55 is typically implemented in a push-pull configuration as shown, which provides a first-order cancellation of the second-order harmonics produced by amplifiers 400, 402. This cancellation is well known to those of skill in the art because the inductors produce signals based on the input signal x which are 180 degrees out-of-phase with one another. Because the output signal y is the difference between the two signals, the second order terms cancel out and y=ax, where a=the gain of the amplifiers 400, 402.

Placing the amplifier 55 after the filter banks, however, misses the opportunity to further reduce noise and distortion produced by the amplifier 55 beyond the cancelled second-order harmonics. This requires additional burdens of performance to be placed on the amplifier 55 at the expense of increased power dissipation. Placing the amplifier 55 before the filter banks lessens the burden on amplifier 55, decreasing the required power dissipation of the amplifier by as much as a factor of 10. But the filters are now subject to the increased signal levels produced by the amplifier and thus must be of higher performance to maintain the same levels of attenuation as well as self-generated noise and distortion.

Figure 15:
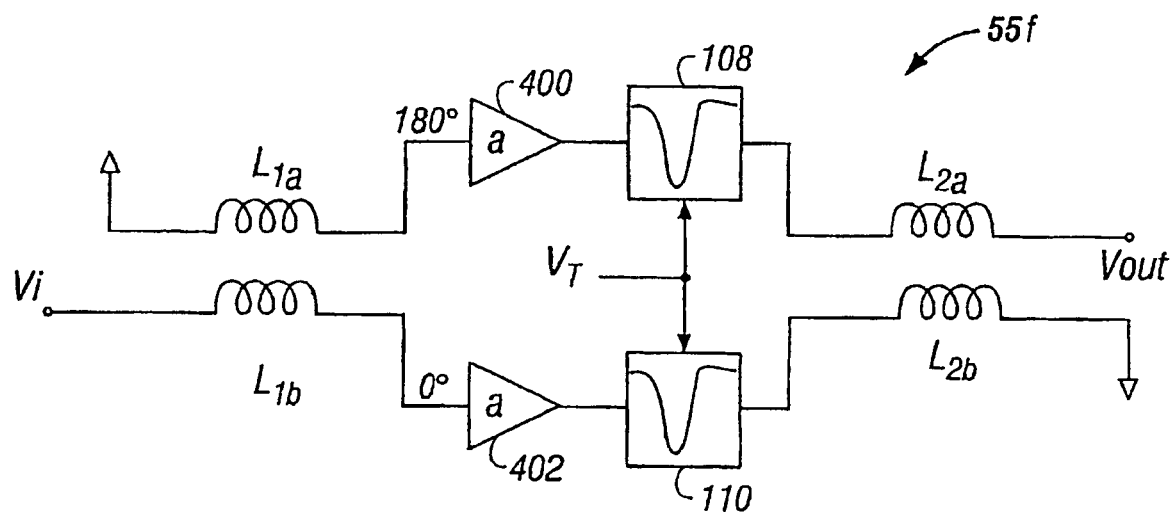
FIG. 15 is an RF amplifier of the present invention having embedded within it any embodiment of the tunable notch or other filters of the present invention.

Thus, an improved embodiment of the present invention is illustrated in FIG. 15, wherein the filter banks are 311, 312, 313 are subsumed within the push-pull 55f. Those of skill in the art will recognize that the filter banks can be implemented in either of three previously described alternative embodiments: switched, switched component or series, provided that they are mirrored in both legs of the amplifier. This embodiment provides the first-order cancellation of the second harmonics self-generated by both the amplifiers 400 and 402, as well as the filters because of the push-pull topology. Moreover, the filters are still able to follow the amplifiers, further reducing distortion generated by the amplifiers, but without being subjected to significantly increased signal levels. This is because the amplitude of the input signal is divided by two for each leg of amplifier 55f before being supplied to the filters.

Those of skill in the art will recognize that the embodiments of the invention are for purposes of illustration only, and the claims should not be limited by such exemplary embodiments. For example, the present invention has been illustrated within the context of television systems, but can be applied to any multichannel system that requires the up-conversion of signals for purposes of combining them to form a multichannel broadband signal. Moreover, those of skill in the art will recognize that the number and type of distortion components that can be filtered using the tunable notch filter concept may be increased or decreased by adding or deleting the cascaded notch filters as required. Further, it should be clear that the assignment of distortion components to the notches are not necessarily fixed and can be optimized for a particular channel frequency or frequency range. It should also be clear that the IF-RF exchange could also be applied to the single-stage converter of the prior art as well as the dual-stage converter as illustrated. Additionally, different systems will vary with respect to the optimal exchange rates that can occur for a given channel frequency, depending the nature of the distortion components of concern and their relationship in frequency to the channel frequency and to the signal of interest. Because the IF-RF level exchange of the present invention is performed on a channel-by-channel basis, complete flexibility is afforded the system designer. The parameters can be provided during manufacturing based on some static optimization performed assuming ideal component values, or they can be optimized for a given up-converter at the time of testing. These and other changes may be made to the embodiments disclosed by example without exceeding the intended scope of the invention.

The invention claimed is:

1. An anti-parallel variable-capacitor (varactor) circuit comprising:
    a first varactor bank comprising one or more varactors connected in parallel with the same polarity orientation;
    a second varactor bank comprising one or more varactors connected in parallel with the same polarity orientation;
    a first capacitor pair comprising the first varactor bank connected in series with a first fixed capacitor;
    a second capacitor pair comprising the second varactor bank connected in series with a second fixed capacitor;
    said first capacitor pair connected in anti-parallel with said second capacitor pair, said varactor banks having mutually opposite polarity orientations relative to signal flow direction;
    circuitry for tuning said first and second varactors;
    an input terminal coupled to one side of said parallel connection of said first and second capacitor pairs; and
    an output terminal coupled to the other side of said parallel connection of said first and second capacitor pairs,
    a circuit including at least one varactor operatively connected in parallel to said first varactor bank by electronically controlled switching; and
    a circuit including at least one varactor connected in parallel to said second varactor bank by electronically controlled switching.

2. The anti-parallel varactor circuit as recited in claim 1, wherein said varactors are varactor diodes.

3. The device as recited in claim 1, wherein said first and said second varactor banks are matched.

4. A band-reject device comprising:
    a first varactor bank comprising one or more varactors connected in parallel with the same polarity orientation;

a second varactor bank comprising one or more varactors connected in parallel with the same polarity orientation;

a first capacitor pair comprising the first varactor bank connected in series with a first fixed capacitor;

a second capacitor pair comprising the second varactor bank connected in series with a second fixed capacitor;

said first capacitor pair connected in anti-parallel with said second capacitor pair, said varactor banks having mutually opposite polarity orientations relative to signal flow direction;

an inductor connected in parallel to said anti-parallel connection of said capacitor pairs;

circuitry for tuning said first and second varactors;

an input terminal coupled to one side of said parallel connection of said inductor and said anti-parallel connection of said capacitor pairs; and an output terminal coupled to the other side of said parallel connection of said inductor and said anti-parallel connection of said capacitor pairs, a circuit including at least one inductor operatively connected in parallel to said first inductor by electronically controlled switching;

a circuit including at least one varactor operatively connected in parallel to said first varactor bank by electronically controlled switching; and a circuit including at least one varactor connected in parallel to said second varactor bank by electronically controlled switching.

5. The band-reject device as recited in claim 4, wherein the first fixed capacitor has capacitance substantially larger than that of the first varactor bank and wherein the second fixed capacitor has capacitance substantially larger than that of the second varactor bank, thereby increasing tuning range of the device, and minimizing signal losses in the pass-band due to parasitic components.

6. The device as recited in claim 5, wherein said varactor banks have mutually opposite polarity orientations relative to signal flow direction, thereby producing a canceling of non-linearity of said varactor banks, but said varactor banks effectively connected in parallel with one another with respect to their terminations, establishing the capacitance values of the varactors as additive and establishing a topography of parasitic resistance and inductance components of the varactors in parallel, thereby minimizing the values of the parasitic resistance and inductance components of the circuit, providing an increase in an unloaded Q of the device, and minimizing signal losses in the pass-band due to the parasitic components.

7. The band-reject device as recited in claim 4, wherein the first and the second varactor banks have substantially equal capacitance, thereby substantially canceling non-linear signal distortion.

8. The device as recited in claim 4, wherein said inductor comprises a transmission line.

9. The device as recited in claim 4, comprising one or more of the first varactor bank, second varactor bank, first capacitor pair, second capacitor pair, and circuitry for tuning said first and second varactors embedded in a filter.

10. The device as recited in claim 4, comprising one or more of the first varactor bank, second varactor bank, first capacitor pair, second capacitor pair, and circuitry for tuning said first and second varactors embedded in a low pass filter.

11. The device as recited in claim 4, comprising two or more of the first varactor bank, second varactor bank, first capacitor pair, second capacitor pair, and circuitry for tuning said first and second varactors having both the input terminals and the output terminals multiplexed by at least one electronically controlled switch.

12. The device as recited in claim 4, comprising two or more of the first varactor bank, second varactor bank, first capacitor pair, and second capacitor pair connected in cascade.

* * * * *